(12) United States Patent
Elkanovich et al.

(10) Patent No.: US 11,031,923 B1
(45) Date of Patent: Jun. 8, 2021

(54) INTERFACE DEVICE AND INTERFACE METHOD FOR 3D SEMICONDUCTOR DEVICE

(71) Applicants: Global Unichip Corporation, Hsinchu (TW); Taiwan Semiconductor Manufacturing Company, Ltd., Hsinchu (TW)

(72) Inventors: Igor Elkanovich, Hsinchu (TW); Amnon Parnass, Hsinchu (TW); Pei Yu, Hsinchu (TW); Li-Ken Yeh, Hsinchu (TW); Yung-Sheng Fang, Hsinchu (TW); Sheng-Wei Lin, Hsinchu (TW); Tze-Chiang Huang, Hsinchu (TW); King Ho Tam, Hsinchu (TW); Ching-Fang Chen, Hsinchu (TW)

(73) Assignees: Global Unichip Corporation, Hsinchu (TW); Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/037,739

(22) Filed: Sep. 30, 2020

Related U.S. Application Data

(63) Continuation-in-part of application No. 16/999,055, filed on Aug. 20, 2020.

(51) Int. Cl.
*H03K 19/0175* (2006.01)
*H03K 3/037* (2006.01)
(Continued)

(52) U.S. Cl.
CPC ......... *H03K 3/0372* (2013.01); *H01L 23/481* (2013.01); *H01L 23/5383* (2013.01); *H03K 19/017509* (2013.01); *H03K 3/35625* (2013.01)

(58) Field of Classification Search
CPC ............. H03K 3/0372; H03K 3/35625; H03K 19/017509
See application file for complete search history.

(56) References Cited

U.S. PATENT DOCUMENTS 6,049,894 A 4/2000 Gates
8,743,582 B2 6/2014 Kang et al.
(Continued)

OTHER PUBLICATIONS

"Office Action of Taiwan Related Application, application No. 109142753", dated Mar. 31, 2021, p. 1-p. 4.

*Primary Examiner* — Patrick O Neill
(74) *Attorney, Agent, or Firm* — JCIPRNET

(57) ABSTRACT

An interface device and an interface method for interfacing between a master device and a slave device is provided. The master device generates command and the slave device generates data according to the command. The interface device includes a master interface and a slave interface. The master interface is coupled to the master device and configured to send the command to the slave device and/or receive the data from the slave device. The slave interface is coupled to the slave device and configured to receive the command from the master device and/or send the data to the master device. The master interface and the slave interface are driven by a clock generated by a clock generator. The master interface and the slave interface are electrically connected by one or plurality of bonds and/or TSVs.

20 Claims, 17 Drawing Sheets

(51) Int. Cl.
    *H01L 23/48*     (2006.01)
    *H01L 23/538*     (2006.01)
    *H03K 3/3562*     (2006.01)

(56) References Cited

U.S. PATENT DOCUMENTS

| | | |
|---|---|---|
| 9,245,827 B2 | 1/2016 | Kang et al. |
| 9,389,953 B2 | 7/2016 | Choi et al. |
| 9,530,442 B1 | 12/2016 | Hassner et al. |
| 10,592,448 B2 * | 3/2020 | Chang .................... G02B 1/041 |
| 10,644,826 B2 | 5/2020 | Wuu et al. |
| 2008/0147964 A1 | 6/2008 | Chow et al. |
| 2019/0213164 A1 * | 7/2019 | Kwon ........................ G06F 1/08 |
| 2019/0347159 A1 | 11/2019 | Chang et al. |
| 2020/0168527 A1 | 5/2020 | Chang et al. |

\* cited by examiner

INTERFACE DEVICE AND INTERFACE METHOD FOR 3D SEMICONDUCTOR DEVICE

CROSS-REFERENCE TO RELATED APPLICATION

This application is a continuation-in-part application of and claims priority benefit of U.S. application Ser. No. 16/999,055, filed on Aug. 20, 2020, now pending. The entirety of the above-mentioned patent application is hereby incorporated by reference herein and made a part of this specification.

BACKGROUND

Technical Field

The disclosure relates to a technology for a 3D semiconductor device, and more particularly an interface device and an interface method for the 3D semiconductor device.

Description of Related Art

Recently, electronic devices, i.e., personal computer (PC) and smartphone, have been evolved in term of packaging, as such, the size of the electronic device becomes compact and the production cost can be reduced accordingly. One of the essential factors to the evolving of the electronic devices is a 3D semiconductor technology. Various semiconductor devices including CPUs and memories can be integrated into a single chip by interconnecting the CPUs and the memories vertically. This structure is generally called as a 3D integrated circuit (3D IC). On the other hand, in order to maintain the reliable data transfer/communication, the interconnection between one CPU/memory with other CPUs/memories needs to be regulated by an interface device. However, the interface device for the 3D integrated circuit is still under development.

SUMMARY

The present disclosure discloses an interface device and an interface method for a 3D semiconductor device. The interface device and the interface method provide reliable data communication between the master device and the slave device.

In an embodiment, the interface device for interfacing between a master device and a slave device is provided. The master device generates command and the slave device generates data according to the command, the interface device includes a master interface and a slave interface. The master interface is coupled to the master device. The master interface is configured to send the command to the slave device and/or receive the data from the slave device. The slave interface is coupled to the slave device. The slave interface is configured to receive the command from the master device and/or send the data to the master device. The master interface and the slave interface are driven by a clock generated by a clock generator. The master interface and the slave interface are electrically connected by one or plurality of bonds. The clock which drives the slave interface is trained by changing a clock phase of the clock to be aligned with a data cluster of the command and/or a data cluster of the data.

In an embodiment, an interface method for interfacing between a master device and a slave device is provided. Command is generated by the master device and data is generated by the slave device according to the command, the interface method includes sending, by a master interface, the command to the slave device and/or receiving the data from the slave device, and receiving, by a slave interface, the command from the master device and/or sending the data to the master device. The master interface and the slave interface are driven by a clock generated by a clock generator. The master interface and the slave interface are electrically connected by one or plurality of bond. The clock which drives the slave interface is trained by changing a clock phase of the clock to be aligned with a data cluster of the command and/or a data cluster of the data.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
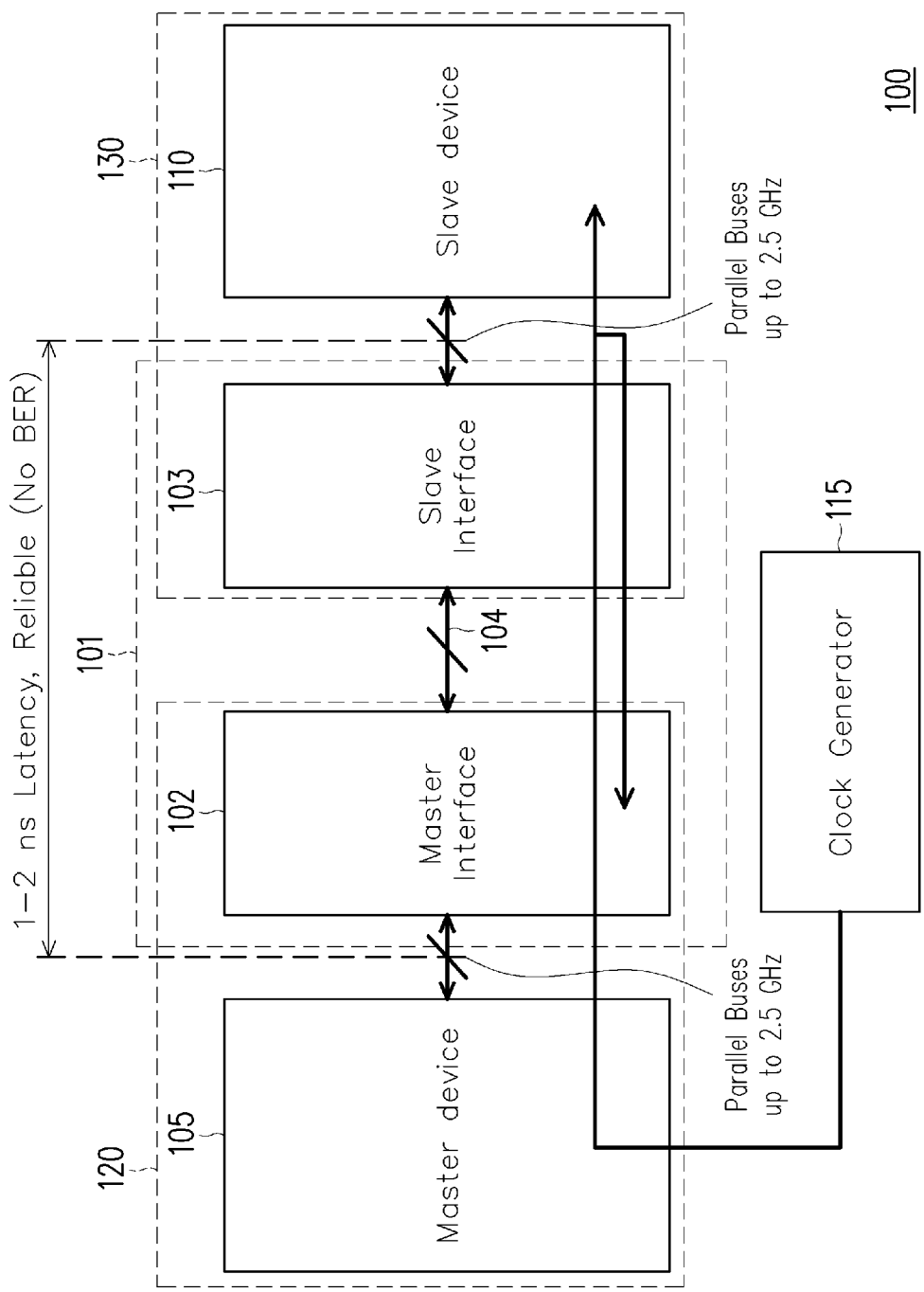
FIG. 1 illustrates a schematically block diagram of a semiconductor device including a master device and a slave device according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure discloses an interface device and an interface method for a 3D semiconductor device. The interface device provides reliable data communication between the master device and the slave device. The reliable data communication is generated by allocating the data latency provided by the master device to each slave device according to a clock generated by the clock generator. Each slave device has a local clock generated according to the clock of the clock generator. Each slave device can adjust the local clock as such the data contention between slave devices can be avoided. Moreover, by avoiding the data contention between each slave device, the bit error can be minimized or avoided, as such the error correction module and method do not need to be used. Accordingly, the data communication speed can be increased.

In addition, each slave device is able to train its local clock by sending a built-in-self-test (BIST) data to the master device when the electronic device is started. By generating the local clock precisely, each slave device is able to provide the precise data having low or zero error rate. By doing so, no error correction is needed and the data communication speed can be improved accordingly. The implementation of the interface device and the interface method, especially in view of the slave-to-master interface implementation, to avoid data contention between each slave device and train the local clock of each slave device will be elaborated according to the embodiments provided as follows.

FIG. 1 illustrates a schematically block diagram of a semiconductor device including a master device and a slave device according to an embodiment of the disclosure. The semiconductor device 100 is implemented in 3D packaging such as chip-on-wafer-on-substrate (CoWoS), system-on-integrated-chip (SoIC), wafer-on wafer (WoW), and other 3D packaging integrations.

Referring to FIG. 1, the semiconductor device 100 includes a master die 120, a slave die 130, and a clock generator 115. The master die 120 is coupled to the slave die 130 by a trough-silicon-via (TSV) 104. The master die 120 includes the master device 105 and the master interface 102 which is coupled to the master device 105. On the other side, the slave die 130 includes the slave device 110 and the slave interface 103 which is coupled to the slave device 110. The master device 105 is coupled to the slave device 110 via the master interface 102 and the slave interface 103. The master interface 102 and the slave interface 103 is coupled via the TSV 104 and integrated together as the interface device 101. The interface device 101 is suitable to connect the master device 105 and the slave device 110 vertically which forms a 3D semiconductor device. The structure of the interface device 101 is called as a Glink-3D. Moreover, the clock generator 115 generates a clock which drives the master device 105, the master interface 102, the slave interface 103, and the slave device 110. The clock generated by the clock generator 115 is used for the master interface 102 and the slave interface 103 in forward and backward directions.

In the embodiment, the master device 105 and the slave device 110 are implemented as, for example, a processor and a memory (i.e., SRAM) respectively. The clock generator 115 is implemented by, for example, an oscillator. The connection between the master interface 102 and the slave interface 103 is implemented by the TSVs having parallel buses used to transfer the data with sampling rate up to 5.0 Gbps or 2.5 GHz of double data rate (DDR). Parallel buses are also used to couple between the slave device 110 and the slave interface 103 and also master device 105 and the master interface 102. In the embodiment, the latency between the master device 105 and the slave device 110 is set to 1-2 ns. Data transfer between the salve device 105 and the slave device 110 has low or no bit error (no BER).

Figure 2:
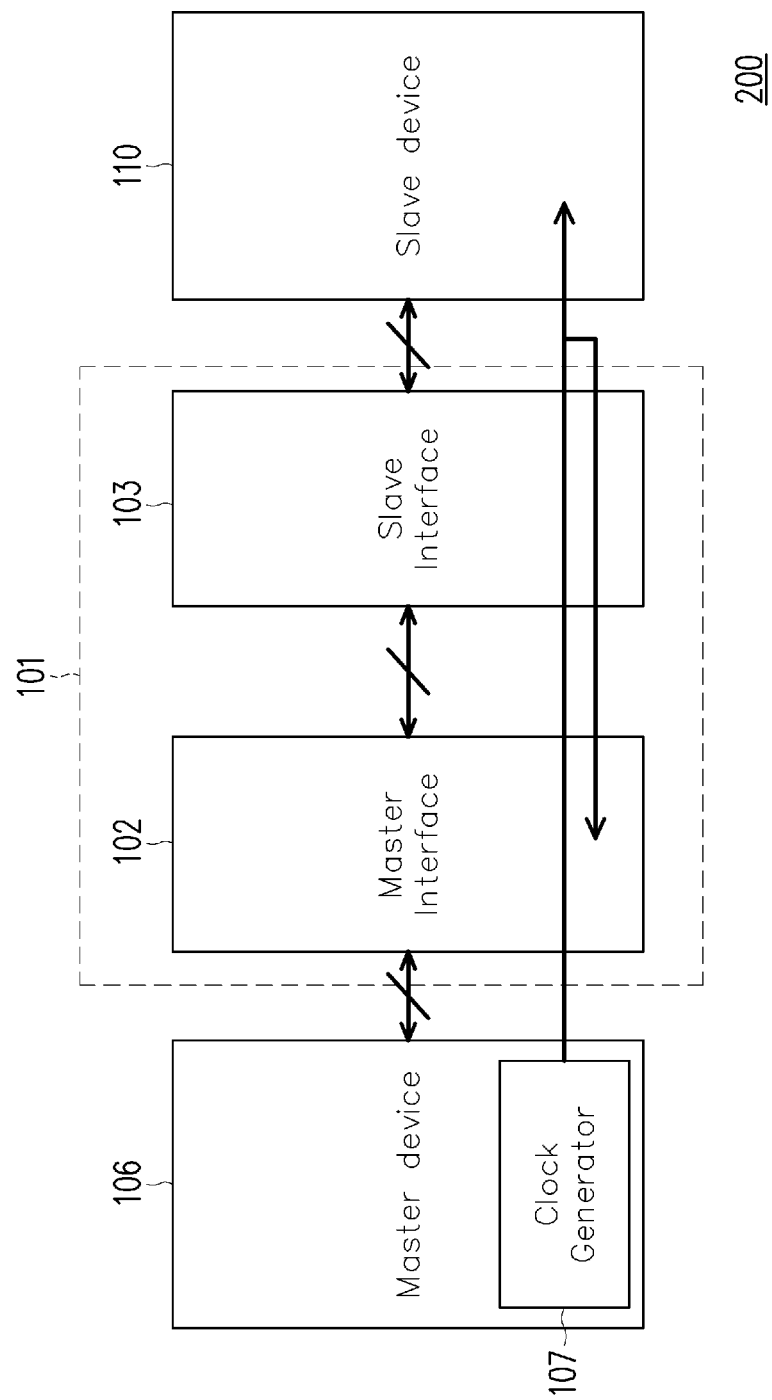
FIG. 2 illustrates a schematically block diagram of a semiconductor device including a master device and a slave device according to an embodiment of the disclosure.

FIG. 2 illustrates a schematically block diagram of a semiconductor device including a master device and a slave device according to an embodiment of the disclosure. The semiconductor device 200 illustrated in FIG. 2 is similar as the semiconductor device 100 illustrated in FIG. 1. The difference is that the clock generator 107 is implemented inside the master device 106 instead of implemented as the external clock generator as shown in FIG. 1.

Figure 3:
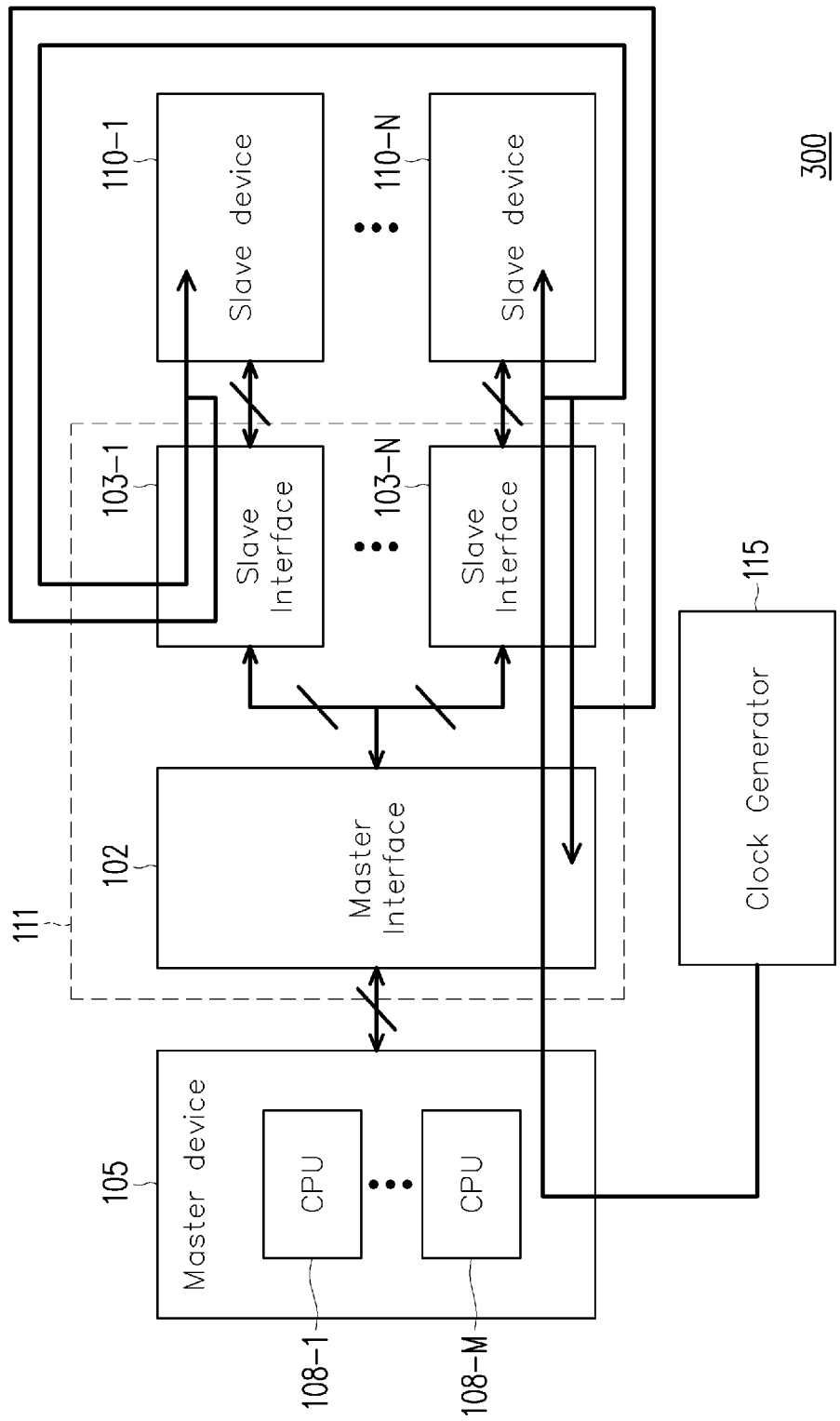
FIG. 3 illustrates a schematically block diagram of a semiconductor device including a master device and a plurality of slave devices according to an embodiment of the disclosure.

FIG. 3 illustrates a schematically block diagram of a semiconductor device including a master device and a plurality of slave devices according to an embodiment of the disclosure. The semiconductor device 300 illustrated in FIG. 3 is similar as the semiconductor device 100 illustrated in FIG. 1. The difference is that the master device 105 includes a plurality of central processing units (CPUs) 108-1 to 108-M. Moreover, the interface device 111 includes the master interface 102 and a plurality of slave interfaces 103-1 to 103-N. Each slave interface 103-1 to 103-N is coupled to each slave device 110-1 to 110-N in one-to-one relationship. N and M are integer numbers equal to or greater than 1. Furthermore, the clock generator 115 generates the clock which is used to drive the master device 105 having the plurality of CPUs 108-1 to 108-M, the master interface 102, the plurality of slave interfaces 103-1 to 103-N, and the plurality of slave devices 110-1 to 110-N. Clock Generator 115 can be included to Master Device 105 as in FIG. 2

Figure 4:
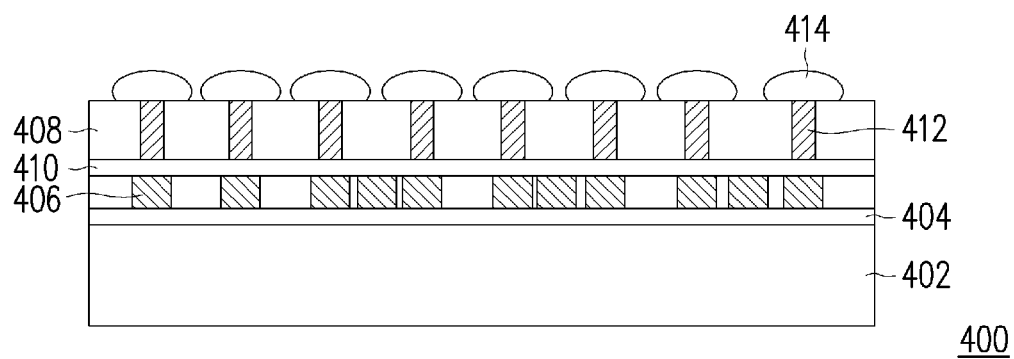
FIG. 4 illustrates a schematically design diagram of a semiconductor device including a master die and a slave die according to an embodiment of the disclosure.

FIG. 4 illustrates a schematically design diagram of a semiconductor device including a master die and a slave die according to an embodiment of the disclosure. The semiconductor device 400 is arranged vertically forming the 3D packaging and includes, for example, the master/processor/chip 1 die 402 coupled with the master interface 404, the slave/memory/chip 2 die 408 coupled with the slave interface 410. The processor die 402 and the memory die 408 are coupled by the plurality of TSVs 406 via the processor interface 404 and the memory interface 410. Moreover, the memory die 408 includes the plurality of TSVs 412 and the plurality of connections 414.

Figure 5:
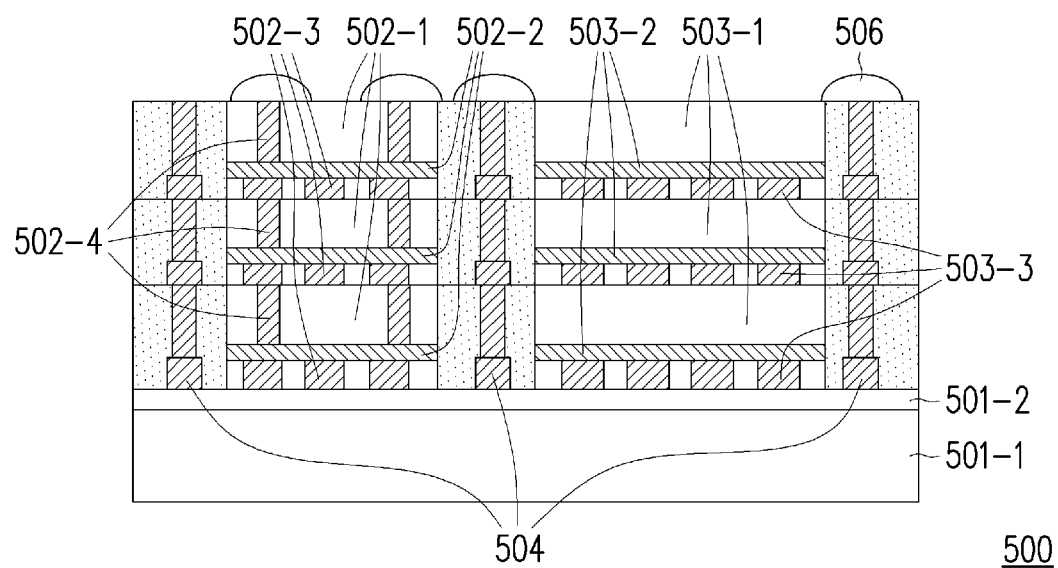
FIG. 5 illustrates a schematically design diagram of a semiconductor device including a master die and a plurality of slave dies according to an embodiment of the disclosure.

FIG. 5 illustrates a schematically design diagram of a semiconductor device including a master die and a plurality of slave dies according to an embodiment of the disclosure. The semiconductor device 500 is arranged vertically forming the 3D packaging and includes, for example, a master die 501-1 coupled to the master interface 501-2, the plurality of first slave dies 502-1 coupled to the plurality of first slave interfaces 502-2, and the plurality of second slave dies 503-1 coupled to the plurality of second slave interfaces 503-2. The plurality of first slave dies 502-1 include the TSVs 502-4. The master interface 501-2 is coupled to the plurality of first slave interfaces 502-2 via the TSVs 502-3 and coupled to the plurality of second slave interfaces 503-2 via the TSVs 503-3. Moreover, the semiconductor device includes the TSVs connections 504 connecting the master interface 501-2 to the connections 506.

In the embodiment, the semiconductor device (i.e., 500) supports face-to-face and face-to-back interfaces. For example, the interface between the master die 501-1 and the first slave die 502-1 and/or between the master die 501-1 and the second slave die 503-1 are the face-to-face interface. And the face-to-back interface is used for the interface between each first slave die 502-1 and/or between each second slave die 503-1.

Figure 6:
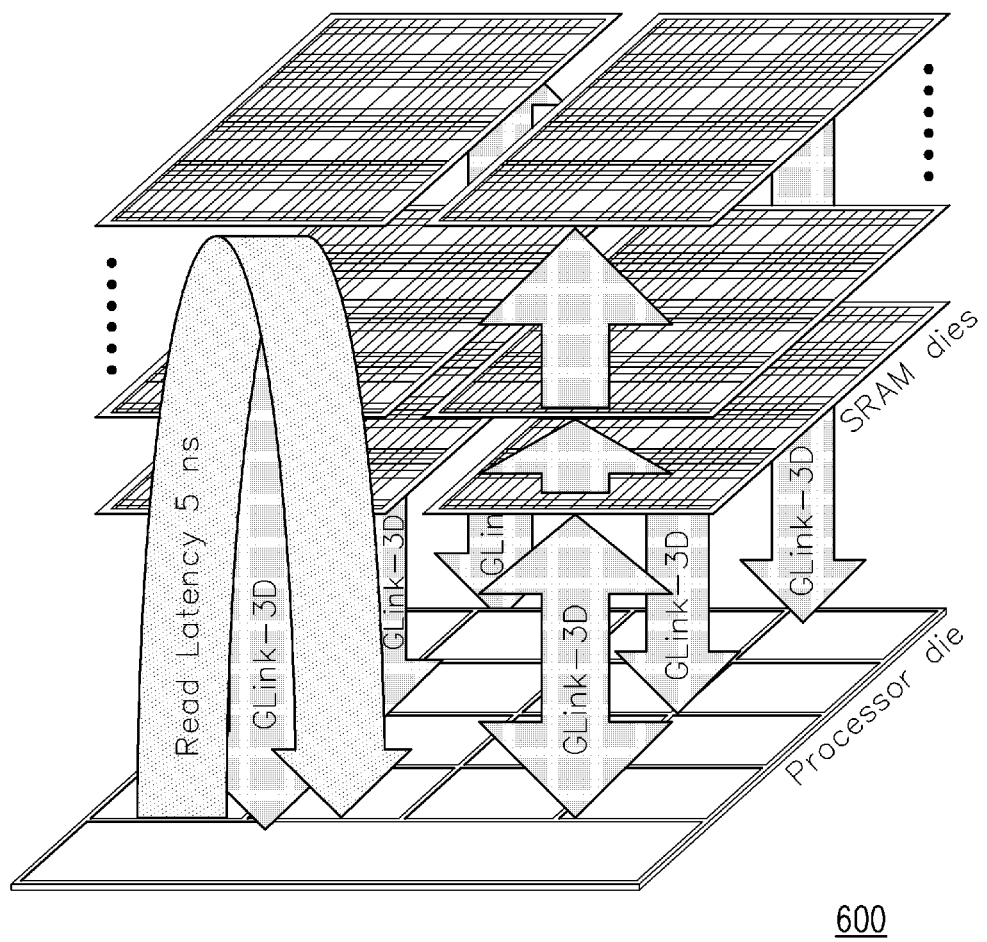
FIG. 6 illustrates a schematically 3D diagram of a semiconductor device including a master die and a plurality of slave dies according to an embodiment of the disclosure.

FIG. 6 illustrates a schematically 3D diagram of a semiconductor device including a master die and a plurality of slave dies according to an embodiment of the disclosure. The semiconductor device 600 includes the processor die including the plurality of CPU cores and the plurality of SRAM dies vertically connected with the processor die via the Glink-3D as the apparatus interface. The read latency of a round-trip data transfer from the processor die to the SRAM die and return to the processor die is equal to or less than 5 ns. This read latency value is implemented to achieve reliable data communication between the processor die and the SRAM dies.

Figure 7:
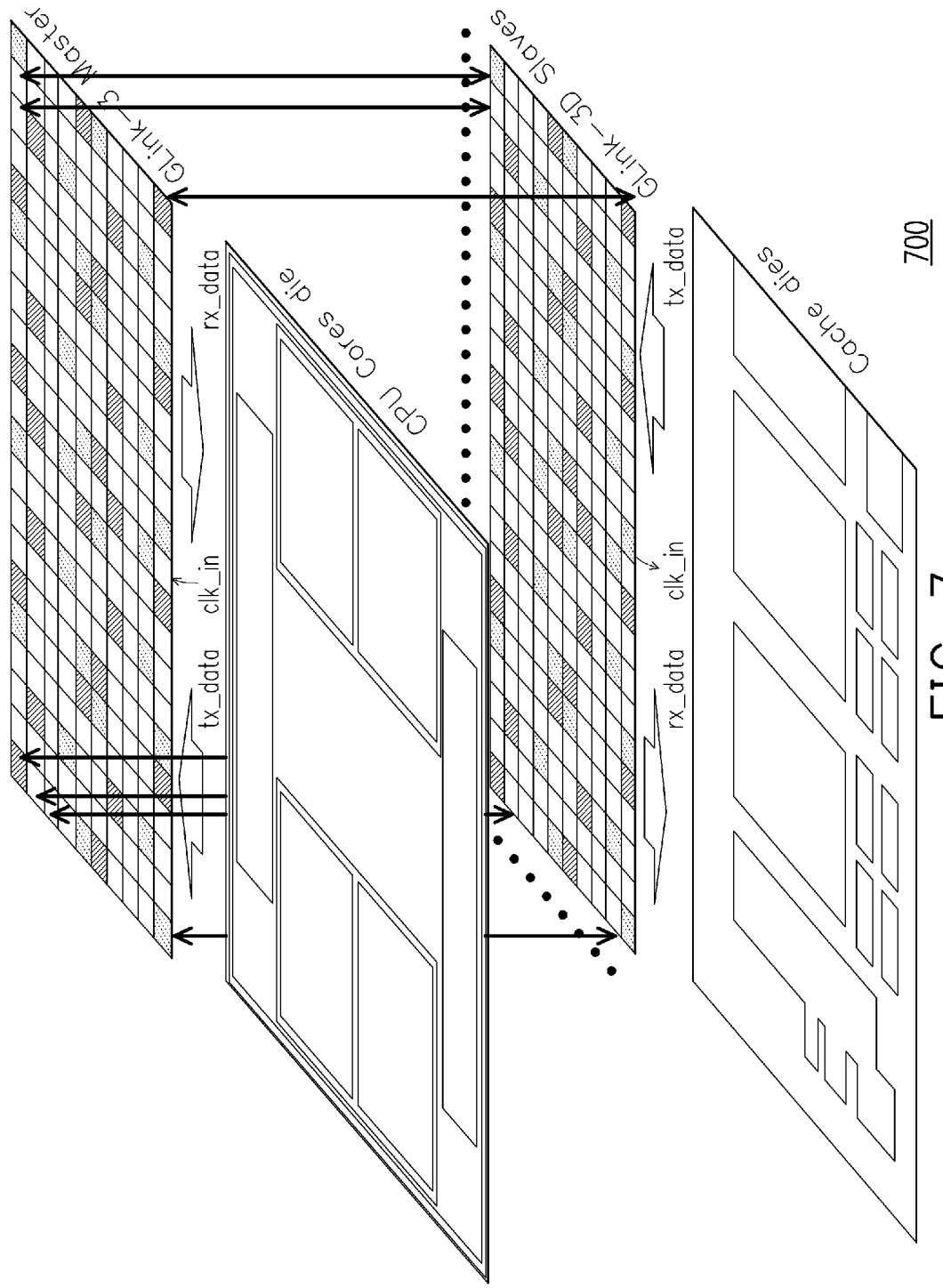
FIG. 7 illustrates a schematically 3D diagram of a semiconductor device including an example of an interface device structure according to an embodiment of the disclosure.

FIG. 7 illustrates a schematically 3D diagram of a semiconductor device including an example of an interface device structure according to an embodiment of the disclosure. The semiconductor device 700 includes a CPU cores die coupled to the Glink-3D master as the master interface and cache dies coupled to the Glink-3D slaves as the slave interfaces. The Glink-3D master is coupled to the Glink-3D slaves via TSVs. During, for example, read operation, the CPU cores die send command to the cache dies via the Glink-3D master and Glink-3D slaves. And then, the cache dies receive the command from the CPU cores die. The cache dies generate data according to the command and send the data to the CPU cores die via the Glink-3D slaves and Glink-3D master. Finally, the CPU cores die receives the data from the cache dies. Moreover, the data communication between the CPU cores die and the cache dies via the Glink-3D master and Glink-3D slaves is driven by the clock generated by the clock generator (i.e., 115).

In this embodiment, the Glink-3D master and the Glink-3D slaves have identical structure and connected in one-to-one relationship. For example, each Glink-3D master and Glink-3D slaves include a plurality of blocks. Each block is divided into a plurality of cells, for example, 5×5 cells. Each cell of the Glink-3D master is connected to each cell of the Glink-3D slaves in one-to-one relationship via the TSV. This Glink-3D structure is used as a physical layer for, for example, an advance microcontroller bus architecture coherent hub interface (AMBA CHI) protocol. The details and corresponding implementations of the interface device including the Glink-3D master and the Glink-3D slaves on the 3D semiconductor device will be further described as follows.

Figure 8:
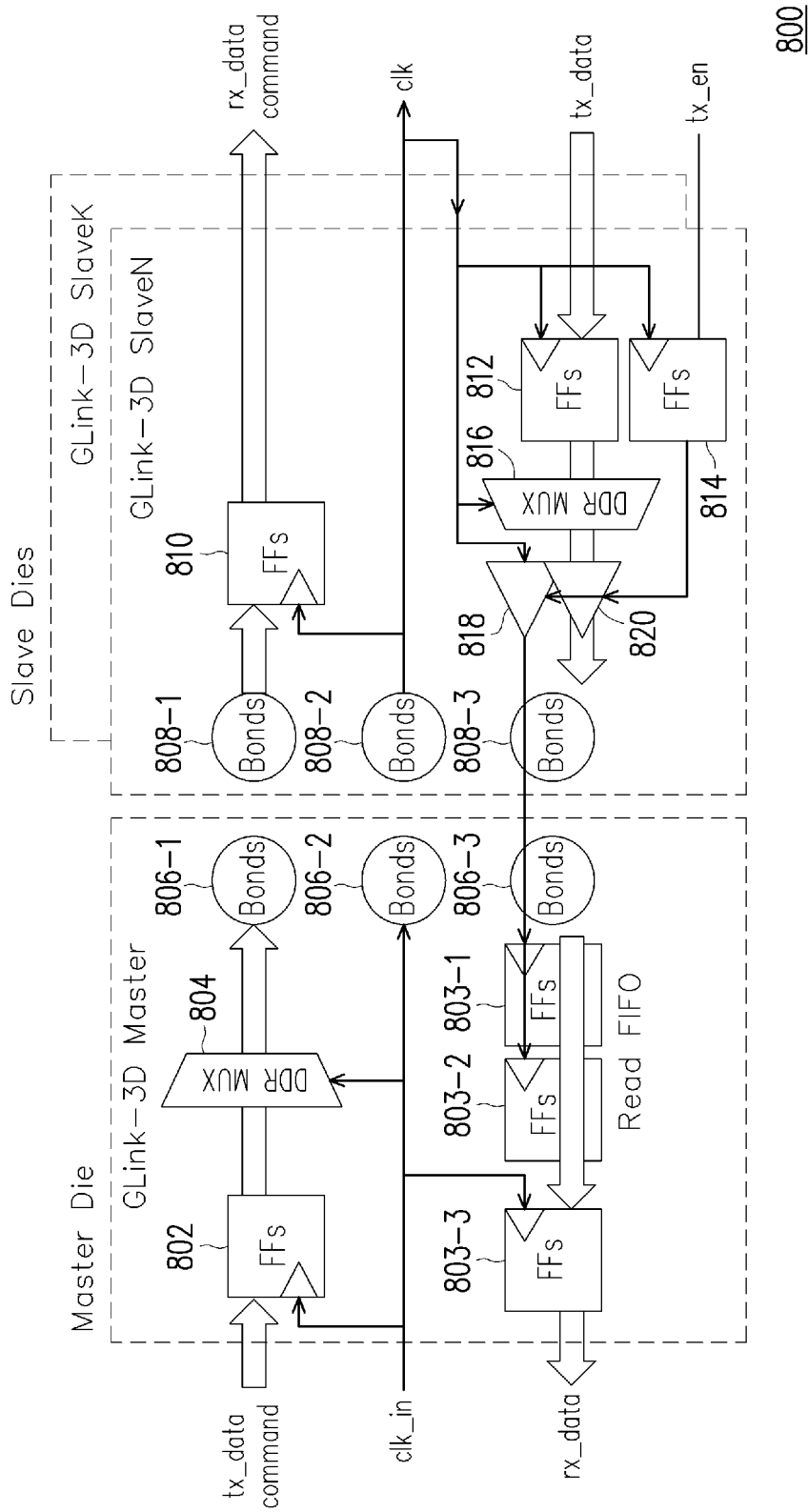
FIG. 8 illustrates a schematically schematic diagram of an interface device including a master interface and a plurality of slave interfaces according to an embodiment of the disclosure.

FIG. 8 illustrates a schematically schematic diagram of an interface device including a master interface and a plurality of slave interfaces according to an embodiment of the disclosure. The schematic diagram 800 may be implemented by using a plurality of electronic components, i.e., flip-flops (FFs), multiplexers (MUXs), inverters, and buffers.

Referring to FIG. 8, Glink-3D master is used as interface for the master die. The Glink-3D slaveK and the Glink-3D slaveN are used as interfaces for the slaveK die and the slaveN die respectively. The Glink-3D master, the Glink-3D slaveK, and the Glink-3D slaveN are driven by the clock clk_in generated by the clock generator (i.e., 115). The Glink-3D master, the Glink-3D slaveK, and the Glink-3D slaveN are electrically connected by one or plurality of bonds. For example, the Glink-3D master bonds 806-1 to 806-3 are connected to the Glink-3D slaveN bonds 808-1 to 808-3 in one-to-one relationship by using the TSVs.

In this embodiment, the Glink-3D master includes the FFs 802, the DDR MUX 804, the bonds 806-1 to 806-3, and the read first-in-first-out (FIFO) including a plurality of FFs 803-1 to 803-3. The FFs 802 is coupled to the DDR MUX 804 and receives the command tx_data command from the master die. The command tx_data command may be formed as, for example, data cluster. The command tx_data command may includes a slave_ID which is used as a slave die address. The DDR MUX 804 is coupled to the bond 806-1 and proceed the command tx_data command to the Glink-3D slaveN via the bonds 806-1 and 808-1 in form of the DDR data format. The FFs 803-1 is coupled to the FFs 803-2 and the bonds 806-3. The FFs 803-3 is coupled to the FFs 803-2 and the master die and send the data rx_data to the master die. The FFs 802, the DDR MUX 804, the bonds 806-2, and the FFs 803-3 are driven the clock generator (i.e., 115) generating clk_in. The FFs 803-1 and 803-2 are driven by the local clock generated by, for example, the Glink-3D slaveN via the bonds 806-3 and 808-3.

In this embodiment, the Glink-3D slaveN includes the bonds 808-1 to 808-3, the FFs 810 to 814, the DDR MUX 816, and the buffers 818 and 820. The bonds 808-1 is coupled to the bonds 806-1 and the FFs 810 sending the command rx_data command to the slaveN die. The bonds 808-2 is coupled to the bonds 806-2 and send the clock clk to the slaveN die. The FFs 812 is coupled to DDR MUX 816 and the slaveN die and receives the data tx_data from the slaveN die. The FFs 814 is coupled to the slave N die and receives the enable signal tx_en. The buffer 820 is coupled to the DDR MUX 816 and the bonds 808-3 and send the data tx_data in form of DDR data format. The buffer 818 is coupled to the bonds 808-3 and send the local clock to the Glink 3D master via the bonds 808-3 and 806-3. The FFs 810 to 814 and the DDR MUX 816 is driven by clock clk. The buffers 818 and 820 are driven by the enable signal tx_en. In addition, the slaveK dies and the corresponding Glink-3D slaveK have the same structure and data communication as the slaveN die and the Glink-3D slaveN. The difference between the Glink-3D slaveN and the Glink-3D slaveK is located in the generating of the local clocks. The process of generating the local clock will be described later according to FIG. 10.

Figure 9:
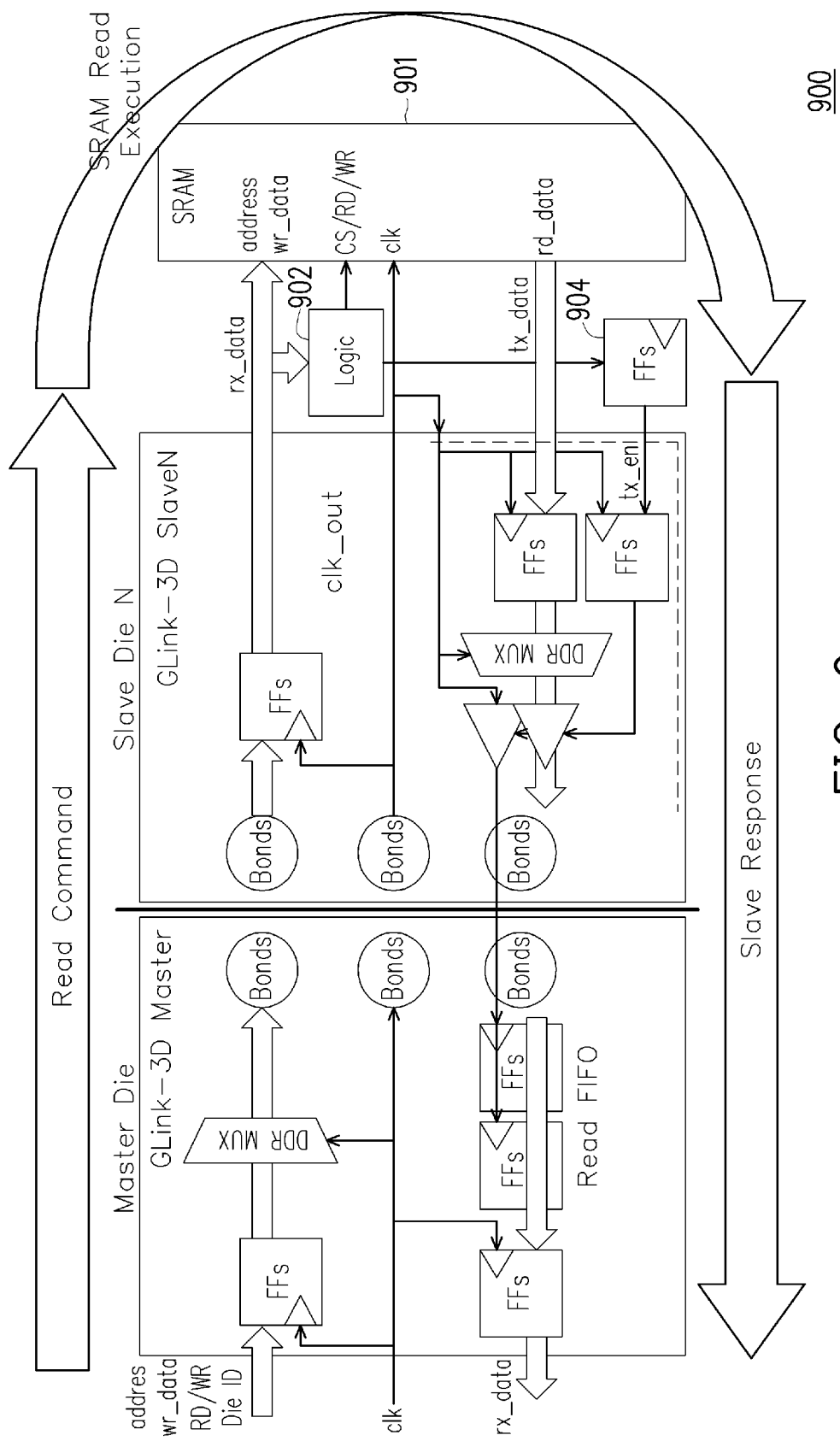
FIG. 9 illustrates a schematically schematic diagram of an interface device including a master die and a slave die during a read operation according to an embodiment of the disclosure.

FIG. 9 illustrates a schematically schematic diagram of an interface device including a master die and a slave die during a read operation according to an embodiment of the disclosure. The schematic diagram 900 is similar with the schematic diagram 800. The difference between the schematic diagrams 900 and 800 is that the schematic diagram 900 shows, for example, one slaveN die with corresponding Glink-3D slaveN and the SRAM 901. In addition, the logic unit 902 and the FFs 904 are included.

Referring to FIG. 9, during read operation, the master die sends to the SRAM 901 via the Glink-3D master and the Glink-3D slaveN the command wr_data including the die ID which is the address of the slave die N. The logic unit 902 is coupled to the Glink-3D slaveN, the SRAM 901, and the FFs 904. The FFs 904 is coupled to the Glink-3D slaveN. The logic unit 902 generates the signal used to choose between the chip select (CS) command, the read (RD) command, or the write (WR) command. The logic unit 902 with corresponding FFs 904 generate the enable signal tx_en. The SRAM 901 generates the data tx_data according to the command. The Glink-3D slaveN sends the data tx_data to the Glink-3D master in form of DDR data format. The master die reads the data tx_data according to the local clock of the Glink-3D slaveN.

Figure 10:
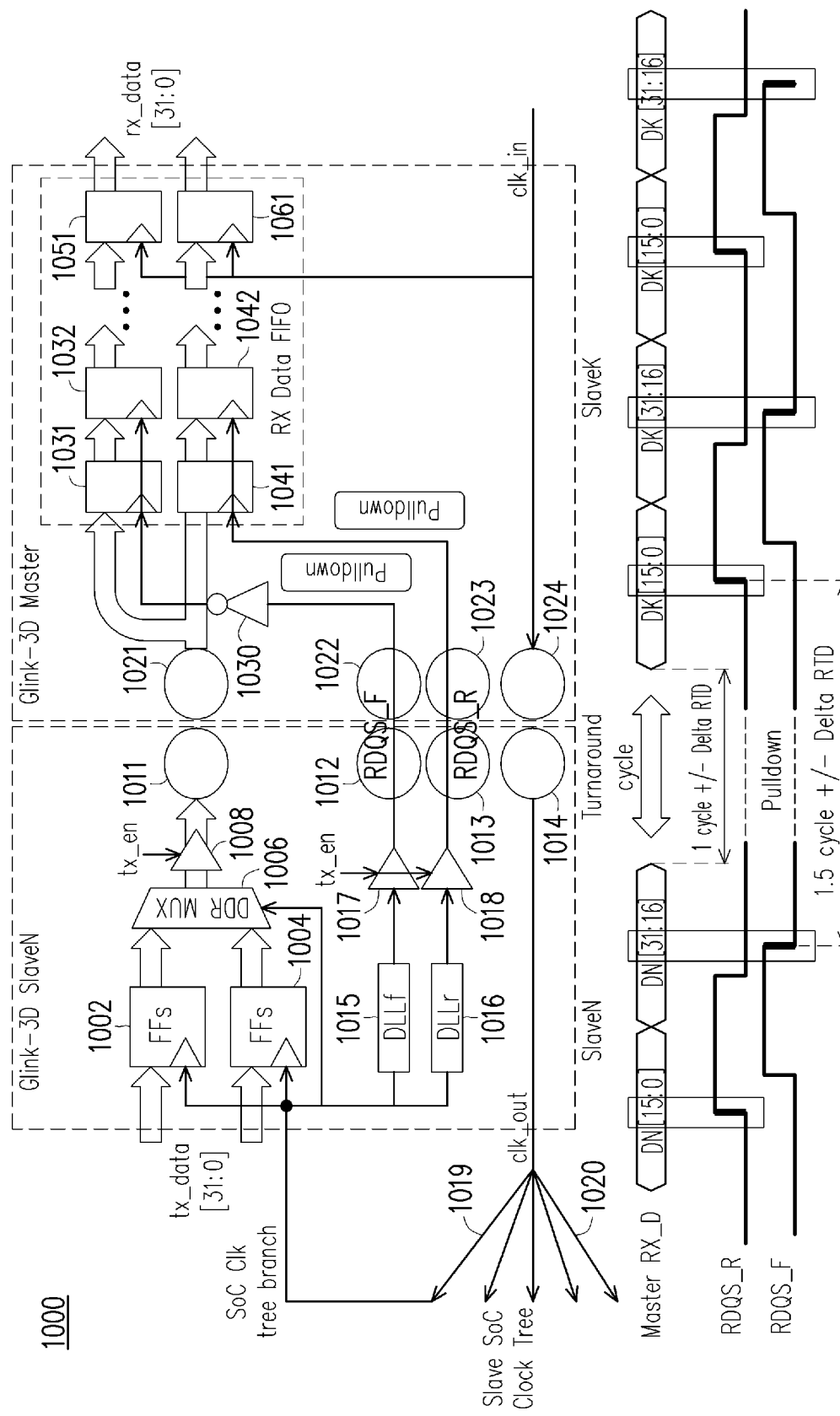
FIG. 10 illustrates a schematically schematic diagram of a slave-to-master interface including a clock tree according to an embodiment of the disclosure.

FIG. 10 illustrates a schematically schematic diagram of a slave-to-master interface including a clock tree according to an embodiment of the disclosure. The schematic diagram 1000 is the same as the schematic diagrams 800 and 900. The difference between the schematic diagram 1000 and the schematic diagrams 800 and 900 is that the schematic diagram 1000 shows more detail circuits included in the data path and the clock path in view of the slave-to-master interface. Moreover, the clock path has the clock tree (i.e., 1019 and 1020) which is used to proceed the clock from the Glink-3D master to each Glink-3D slave. In addition, the timing diagram of the data in form of the DDR data format sent from the Glink-3D slaveN and the Glink-3D slaveK to the Glink-3D master is provided.

In this embodiment, each one of the slave interface Glink-3D slaveN and the other slave interfaces (i.e., Glink-3D slaveK) is further configured to send the data/other data (i.e., tx_data [31:0]) to the master interface using a double data rate (DDR) configuration. For example, the data tx_data [31:0] is folded into the data tx_data[31:16] and the data tx_data[15:0]. Each of the data tx_data[31:16] and the data tx_data[15:0] is called as, for example, data cluster.

In this embodiment, the DDR configuration is generated by a DDR unit which includes a first FF 1002, a second FF 1004, and a multiplexer 1006. The first FF 1002 and second FF 1004 are represented as the FFs 812 of FIG. 8, and the multiplexer 1006 is represented by the DDR MUX 816 of FIG. 8. The first FF 1002, the second FF 1004, and the multiplexer 1006 are driven by the clock 1019. The first FF 1002 is configured to generate part of data (i.e., data tx_data[31:16]) according to the data/other data (i.e., tx_data [31:0]). The second FF 1004 is configured to generate other part of data (i.e., data tx_data[15:0]) according to the data/other data (i.e., tx_data[31:0]). The multiplexer 1006 is coupled to the first FF 1002 and the second FF 1004. The multiplexer 1006 is configured to send the part of data tx_data[31:16] and the other part of data tx_data[15:0]) to the master device via the buffer 1008. The buffer 1008 is represented by the buffer 820 of the FIG. 8. The buffer 1008 is enabled by the enable signal tx_en. The enable signal tx_en shown in FIG. 10 is the same as the enable signal tx_en shown in FIGS. 8 and 9. By enabling the buffer 1008, the part of data tx_data[31:16] and the other part of data tx_data[15:0] are sent to the Glink-3D master via the bonds 1011 and 1021.

In another embodiment, each one of the slave interface (i.e., Glink-3D slaveN) and the other slave interfaces (i.e., Glink-3D slaveK) further includes a first strobe 1015 and a second strobe 1016. The first strobe 1015 and the second strobe 1016 are coupled to the clock path 1019. The first strobe 1015 is configured to generate a first local clock RDQS_F according to the clock clk_in generated by the clock generator (i.e., 115). The second strobe 1016 is configured to generate a second local clock RDQS_R according to the clock clk_in generated by the clock generator (i.e., 115). The clock path 1019 is one branch of the clock tree (i.e., 1019, 1020). The clock clk_in is proceed as clk_out via the bonds 1024 and 1014. The clock path 1019 proceeds the clock clk_out to the first FF 1002, the second FF 1004, the multiplexer 1008, the first strobe 1015, and the second strobe 1016 via the clock path 1019. The first local clock RDQS_F is proceeded to the Glink-3D master via the bonds 1012 and 1022 by the buffer 1017. The buffer 1017 is enabled according to the enable signal tx_en. The enable signal tx_en shown in FIG. 10 is the same as the enable signal tx_en shown in FIGS. 8 and 9. The second local clock RDQS_R is proceeded to the Glink-3D master via the bonds 1013 and 1023 by the buffer 1018. The buffer 1018 is enabled according to the enable signal tx_en. The enable signal tx_en shown in FIG. 10 is the same as the enable signal tx_en shown in FIGS. 8 and 9.

In this embodiment, the first local clock RDQS_F generated by the first strobe 1015 is used by the Glink-3D master to read the part of data tx_data[31:16] generated by the first FF 1002, and the second local clock RDQS_R generated by the second strobe 1016 is used by the Glink-3D master to read the other part of data tx_data[15:0] generated by the second FF 1004. For instance, the Glink-3D master includes a block of unit configured to read the part of data tx_data [31:16] according to the first local clock RDQS_F and read the other part of data tx_data[15:0] according to the second local clock RDQS_R. The Glink-3D master reads the part of data tx_data[31:16] and the other part of data tx_data[15:0] by using the DDR data format. Therefore, the Glink-3D master combines the part of data tx_data[31:16] and the other part of data tx_data[15:0] to generate the complete data rx_data[31:0]. The Glink-3D master, then, sends the complete data rx_data[31:0] to the processor.

In this embodiment, the Glink-3D master further includes a FIFO unit. The FIFO unit of FIG. 10 is also represented as the FIFO unit of FIGS. 8 and 9. The FIFO unit may be implemented to obtain the function of the block of unit as previously described. The FIFO unit may be implemented by a plurality of FFs (i.e., 1031, 1032, 1051, 1041, 1042, 1061). The FFs 1031 and 1041 represent the FFs 803-1 of FIG. 8. The FFs 1032 and 1042 represent the FFs 803-2 of FIG. 8. The FFs 1051 and 1061 represent the FFs 803-3 of FIG. 8. Specifically, the FFs 1031 and 1041 are coupled to the bonds 1021 to receive the part of data tx_data[31:16] and the other part of data tx_data[15:0]. The FFs 1031 is coupled to the bonds 1022 via the inverter 1030 to receive the first local clock RDQS_F. The FFs 1041 is coupled to the bonds 1023 to receive the second local clock RDQS_R. The FFs 1031 and 1041 are coupled to the FFs 1032 and 1042 respectively to form the FIFO unit. The number of FFs is not limited to a specific number. The number of FFs can be implemented by any number of FFs.

Moreover, the FIFO unit includes the FFs 1051 and 1061. The FFs 1051 and 1061 are configured to process the part of data tx_data[31:16] and the other part of data tx_data[15:0] based on the DDR data format. The FFs 1051 is coupled to, for example, the FFs 1032, and the FFs 1061 is coupled to, for example, the FFs 1042. The FFs 1051 and 1061 are configured to retime the part of data tx_data[31:16] and the other part of data tx_data[15:0] of the FIFO unit from the Glink-3D slaveN and the other Glink-3D (i.e., Glink-3D slaveK) by using the clock generated by the clock generator (i.e., 115). The retime process is performed in order to synchronize the part of data tx_data[31:16] and the other part of data tx_data[15:0] with the clock clk_in. By synchronizing with the clock clk_in, the part of data tx_data [31:16] and the other part of data tx_data[15:0] are sampling at the same frequency and the same phase with, for example, the command tx_data command generated by the processor.

For instance, the FFs 1031 and 1041 receive the part of data tx_data[31:16] and the other part of data tx_data[15:0]. The FFs 1031 samples the part of data tx_data[31:16] by the first local clock RDQS_F received from the first strobe 1015. The FFs 1031 sends the part of data tx_data[31:16] to the FFs 1032. The FFs 1051 receives the part of data tx_data [31:16] from, for example, the FFs 1032 and sampling the part of data tx_data[31:16] based on the clock clk_in. Accordingly, the FFs 1041 samples the other part of data tx_data[15:0] by the second local clock RDQS_R received from the second strobe 1016. The FFs 1041 sends the other part of data tx_data[15:0] to the FFs 1042. The FFs 1061 receives the other part of data tx_data[15:0] from, for example, the FFs 1042 and sampling the other part of data tx_data[15:0] based on the clock clk_in. Finally, the FFs 1051 and 1061 generate and send the complete data rx_data [31:0] to the processor. That is, the FIFO unit of the Glink-3D master processes the data tx_data[31:0] received from, for example, the Glink-3D slaveN to generate the complete data rx_data[31:0] based on the DDR data format.

In another embodiment, referring to FIG. 10, the master device (i.e., the processor) further generates a turn-around (TA) cycle. The TA cycle is an interval between, for example, the data tx_data of the Glink-3D slaveN and the data tx_data of the Glink-3D slaveK received by the FIFO unit of Glink-3D master at the bonds 1021. For instance, the data tx_data received by the FIFO unit of Glink-3D master at the bonds 1021 refers to a Master RX_D. The Master RX_D received from the Glink-3D slaveN contains data DN[15:0] and DN[31:16]. The Master RX_D received from the Glink-3D slaveK contains data DK[15:0] and DK[31: 16]. That is, the TA cycle is the interval between the data DN[31:16] and the data DK[15:0].

In this embodiment, the TA cycle is used to prevent bus contention between the slave device (i.e., slaveN device) and the other slave devices (i.e., slaveK device) responses. For instance, during read operation, the master device/processor send the command including the slave ID to the slaveN device and the slaveK device with the allocated time slot. The slaveN device and the slaveK device send the data and the local clocks to the processor according to the allocated time slot via the Glink-3D slaveN and the Glink-3D slaveK respectively. The slaveN device and the slaveK device use the data bus according to the allocated time slot. The Glink-3D slaveN send the data tx_data[31:0] to the Glink-3D master via the bonds 1011. The Glink-3D slaveN also send the first local clock RDQS_F and the second local clock RDQS_R to the Glink-3D master via the bonds 1012 and 1013 respectively. The Glink-3D master receives the data DN[15:0] and DN[31:16] from the Glink-3D slaveN at the bonds 1021. The Glink-3D master samples the data DN[15: 0] by using the second local clock RDQS_R. The Glink-3D master samples and DN[31:16] by using the first local clock RDQS_F.

And then, the Glink-3D slaveK send the data tx_data[31: 0] to the Glink-3D master via the corresponding bonds of the Glink-3D slaveK. The Glink-3D slaveK also send the first local clock RDQS_F and the second local clock RDQS_R to the Glink-3D master via the corresponding bonds of the Glink-3D slaveK. The Glink-3D master receives the data DK[15:0] and DK[31:16] from the Glink-3D slaveK at the bonds 1021 after the TA cycle. The Glink-3D master samples the data DK[15:0] by using the second local clock RDQS_R. The Glink-3D master samples and DK[31:16] by using the first local clock RDQS_F.

That is, the TA cycle prevents the bus contention between the slaveN device and the slaveK device by providing the time slot for the slaveN and the slaveK to use the data bus during the data transfer from the slaveN device and the slaveK device to the processor.

In this embodiment, the TA cycle is used to compensate a round-trip-delays (RTDs) difference between the slave device and the other slave devices. The RTDs is an interval between the command sent by the Glink-3D master and the data received by the Glink-3D master. Since each slave device is, for example, produced by different manufacture company, each slave device has different response characteristic. The response characteristic includes the RTDs. The RTDs difference between the slave devices is compensated by the TA cycle.

For instance, during read operation, the slaveN device and the slaveK device receive the command from the processor via the Glink-3D slaveN and the Glink-3D slaveK respectively. Since the slaveN device has different RTDs with the slaveK device, the Glink-3D master receives the data from the Glink-3D slaveN and the Glink-3D slaveK at the different time. Although the Glink-3D master has been equipped with the pulldown function, the bus contention may be happened if the RTDs difference are greater than the allocation time slot difference allocated by the processor to the slaveN device and the slaveK device. Therefore, by adding the TA cycle to the RTDs difference (i.e., 1 cycle+/− delta RTD, 1.5 cycle+/−delta RTD), the interval between the time when the data received from the Glink-3D slaveN (DN[15:0] and DN[31:16) and the time when the data received from the Glink-3D slaveK (DK[15:0] and DK[31: 16) is maintained, as such, the bus contention can be avoided.

Figure 11:
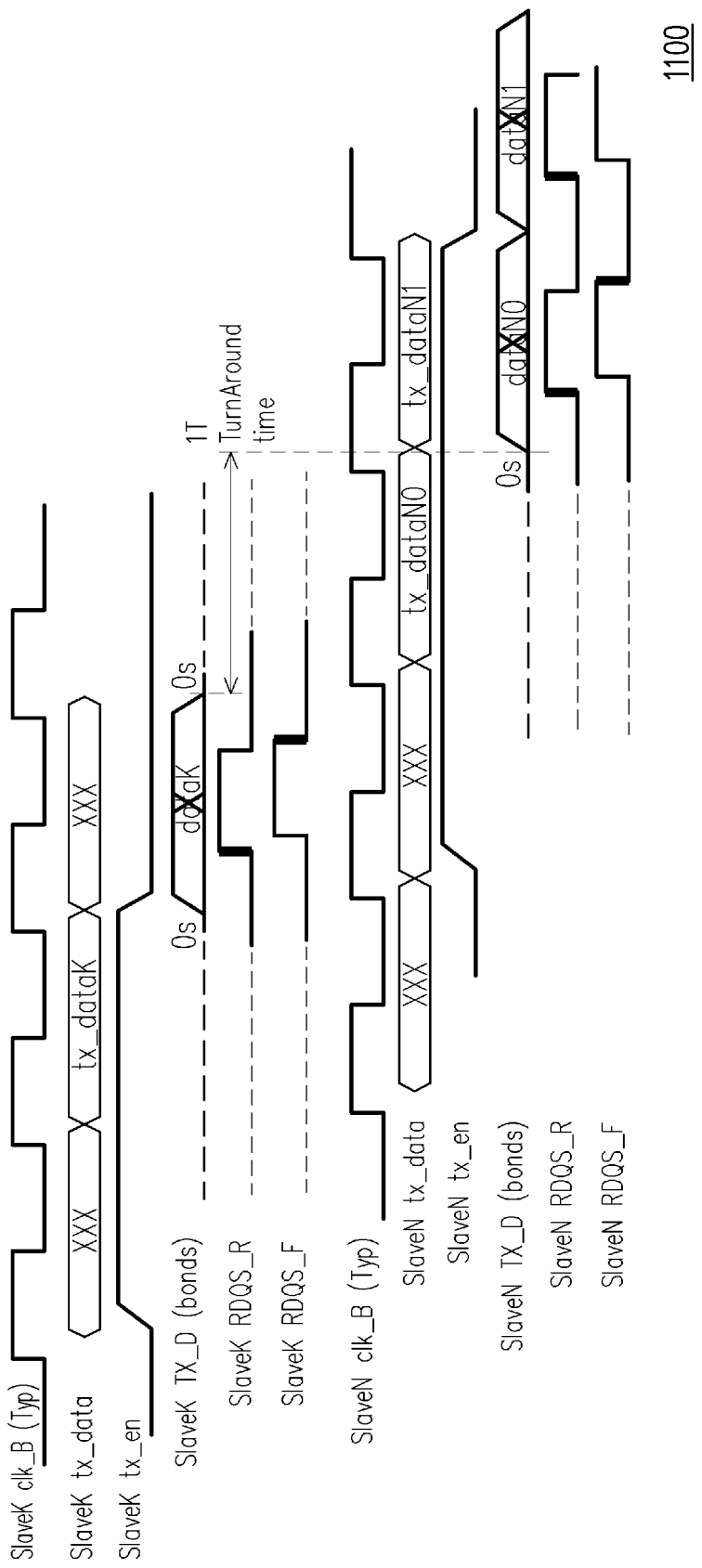
FIG. 11 illustrates a schematically timing diagram of data between two slave dies having same local clock speed according to an embodiment of the disclosure.
Figure 12:
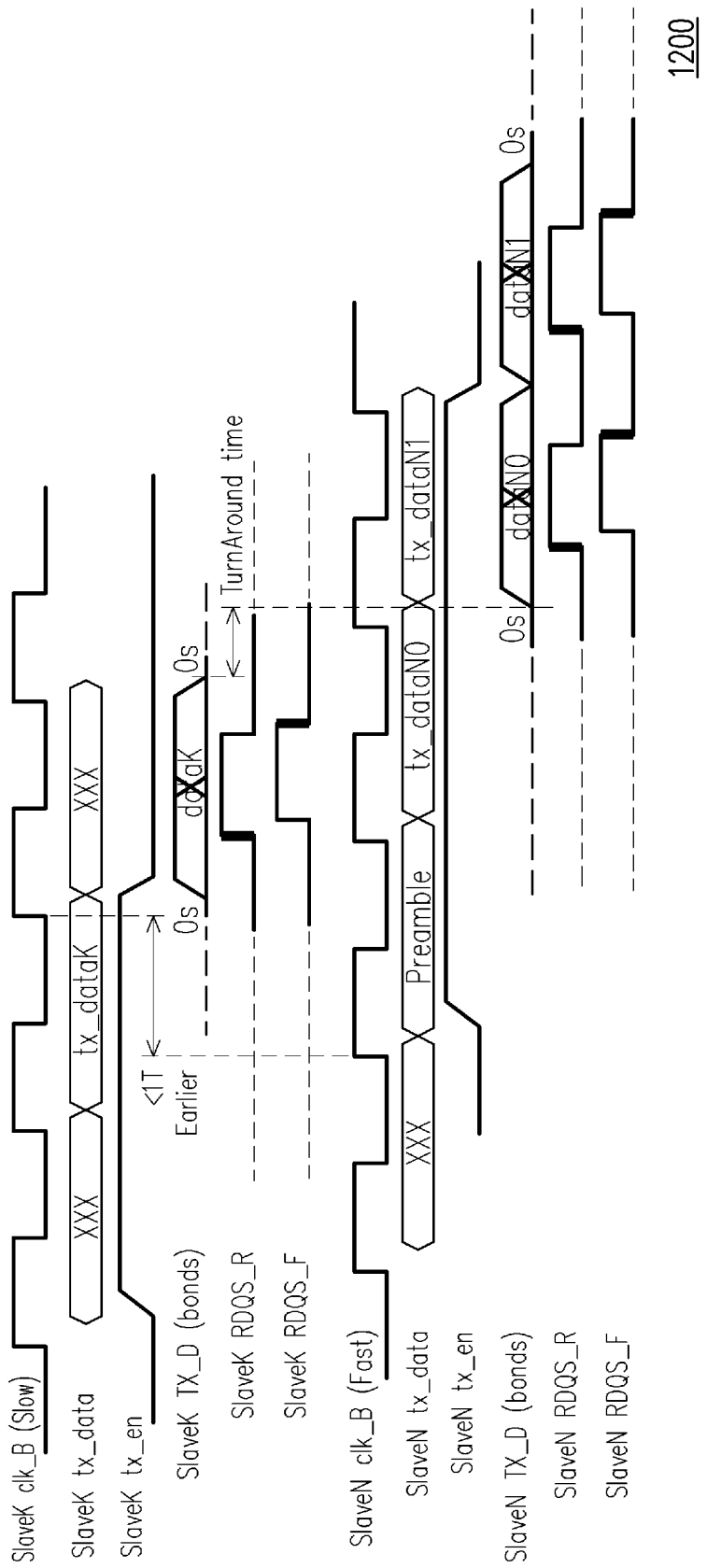
FIG. 12 illustrates a schematically timing diagram of data between two slave dies having different clock speed according to an embodiment of the disclosure.

FIG. 11 illustrates a schematically timing diagram of data between two slave dies having same clock speed according to an embodiment of the disclosure. And FIG. 12 illustrates a schematically timing diagram of data between two slave dies having different clock speed according to an embodiment of the disclosure. The slaveN device and the slaveK device are used as an example of the timing diagram.

In this embodiment, the slave device (i.e., slaveN device) and the other slave devices (i.e., slaveK device) generate zero data before and after the data in order to prevent the bus contention between the slave device and the other slave devices due to different the RTDs. Referring to FIG. 11, the clock slaveK clk_B speed and the clock slaveN clk_B speed have same speed (i.e., normal/typical speed). The slaveK device is equipped with the enable signal tx_en and send the data tx_dataK to the master device via the Glink-3D slaveK. The Glink-3D slaveK proceed the data dataK to the Glink-3D master via the bonds (i.e., 1011). Accordingly, the Glink-3D slaveK send the zero data before and after the data dataK to the Glink-3D master via the bonds (i.e., 1011). The Glink-3D slaveK also generates the local clocks RDQS_R and RDQS_F.

On the other hand, the slaveN device is equipped with the enable signal tx_en and send the data tx_dataN0 and tx_dataN1 to the master device via the Glink-3D slaveN. The Glink-3D slaveN proceed the data dataN0 and dataN1 to the Glink-3D master via the corresponding bonds. Accordingly, the Glink-3D slaveN send the zero data before and after the data dataN0 and dataN1 to the Glink-3D master via the corresponding bonds. The Glink-3D slaveN also generates the local clocks RDQS_R and RDQS_F. Since the data dataK is equipped with the zero data after the data dataK and the data dataN0 is equipped with the zero data before the data dataN0, there is an interval (i.e., 1T TA time) between the data dataK and the data dataN0.

That is, the zero data generated by the slaveN device and the slaveK device generates the interval (i.e., 1T TA time) between the data dataK and the data dataN0 in order to prevent the bus contention between the slaveN device and the slaveK device in condition where the clock slaveK clk_B and the clock slaveN clk_B have the same speed.

In another embodiment, referring to FIG. 12, the different between embodiment of FIG. 11 and embodiment of FIG. 12 is that the clock slaveK clk_B speed and the clock slaveN clk_B speed have different speed. For example, the clock slaveK clk_B has slow speed and the clock slaveN clk_B has fast speed. In other words, the clock slaveN clk_B is faster than the clock slaveK clk_B. In other words, the clock slaveN clk_B is earlier than the clock slaveK clk_B. The interval of the earlier clock is less than 1T (<400 ps for 2.5 GHz). Since the data dataK is equipped with the zero data before and after the data dataK and the data dataN0 is equipped with the zero data before the data dataN0, there are an interval (<1T) between the clock slaveN clk_B and the clock slaveK clk_B and an interval (TA time) between the data dataK and the data dataN0.

That is, the zero data generated by the slaveN device and the slaveK device generates the interval (TA time) between the data dataK and the data dataN0 in order to prevent the bus contention between the slaveN device and the slaveK device in condition where the clock slaveK clk_B and the clock slaveN clk_B have different speed.

Figure 13:
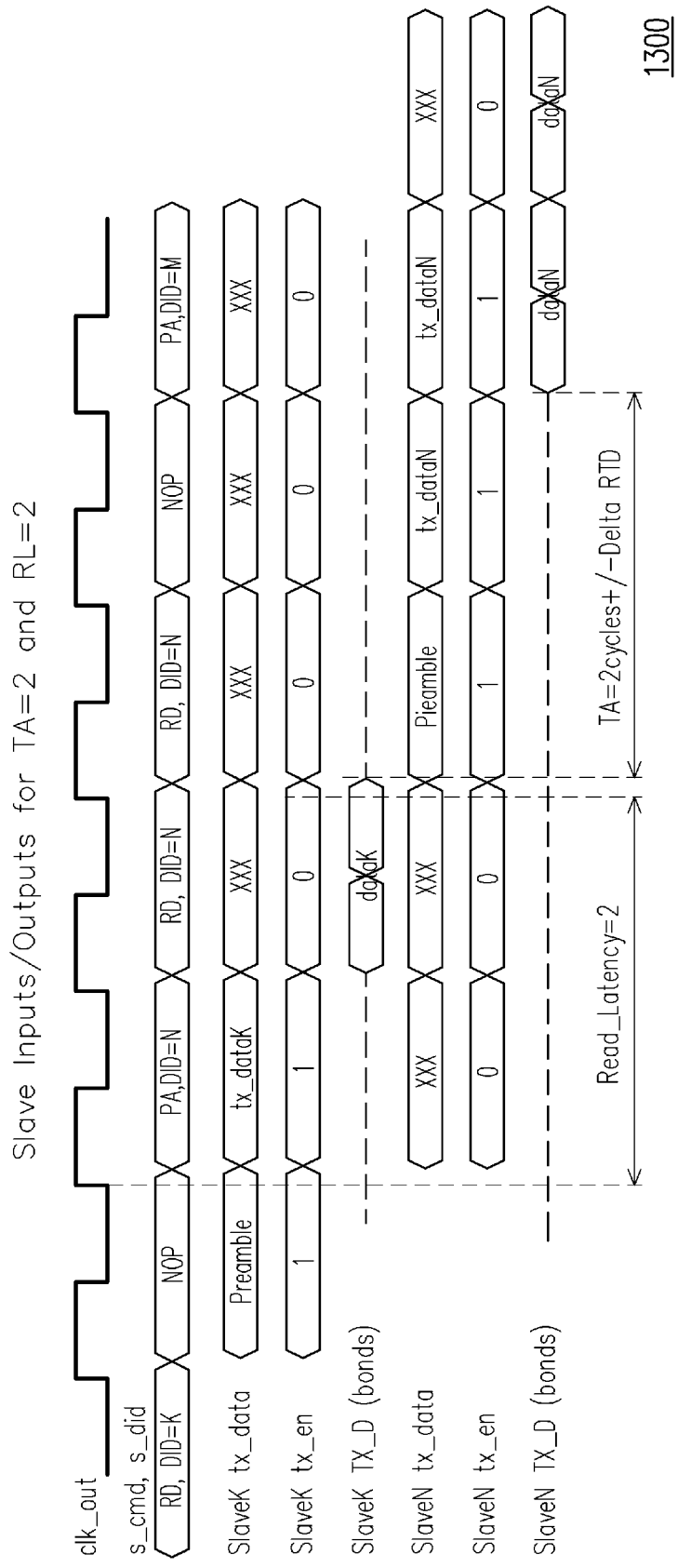
FIG. 13 illustrates a schematically timing diagram of data between two slave dies having 2 cycles of TA according to an embodiment of the disclosure.

FIG. 13 illustrates a schematically timing diagram of data between two slave dies having 2 cycles of TA according to an embodiment of the disclosure. The timing diagram 1300 includes 2 cycles of the read latency and 2 cycles of TA. The read latency is an interval between a time when the Glink-3D slave receives the command from the master device via the corresponding bonds and a time when the Glink-3D slave sends the data according to the command via the corresponding bonds.

Specifically, for example, during read operation, the Glink-3D slaveK and the Glink-3D slaveN receive the command s_cmd including the slave ID d_did and the corresponding clock clk_out. The master device sends the command NOP between the read command RD sent to the slaveK device and the preamble command PA to the slaveN device. The command NOP is a no operation command. The preamble command PA is a command for the slave device to prepare the data. The read command RD is a read command for the slave device to send the data after the slave device has prepared the data.

In this embodiment, the slaveK device sends the data (i.e., tx_dataK, preamble) at the allocated time slot earlier than the slaveN device sending the data (i.e., tx_dataN, preamble) according to the time slot allocated by the master device. The data sent by the slaveK device (i.e., tx_dataK, preamble) and/or the data sent by the slaveN device (i.e., tx_dataN, preamble) are proceeded to the corresponding slave bonds TX_D when the enable signal tx_en is activated (i.e., 1). In vise versa, the data sent by the slaveK device (i.e., tx_dataK, preamble) and/or the data sent by the slaveN device (i.e., tx_dataN, preamble) are not proceeded to the corresponding slave bonds TX_D when the enable signal tx_en is deactivated (i.e., 0). In condition when the read latency has 2 cycles, the interval between, for example, the command NOP received by the Glink-3D slaveK and the data dataK sent by the Glink-3D slaveK at the corresponding slave bonds TX_D is 2 cycles. The read latency having 2 cycles corresponds to the command NOP sent by the master device. On the other hands, in condition when TA has 2 cycles, the interval between the data dataK sent by the Glink-3D slaveK at the corresponding slave bonds TX_D and the data dataN sent by the Glink-3D slaveN at the corresponding slave bonds TX_D is 2 cycles +/−delta RTD.

That is, the TA having 2 cycles tolerates up to 2T difference and be set by adding the command NOP before the preamble command PA by the master device. Moreover, the TA having 1 cycle is enough in condition when the RTD difference is less than 1 period T (400 ps for 2.5 GHz).

Figure 14:
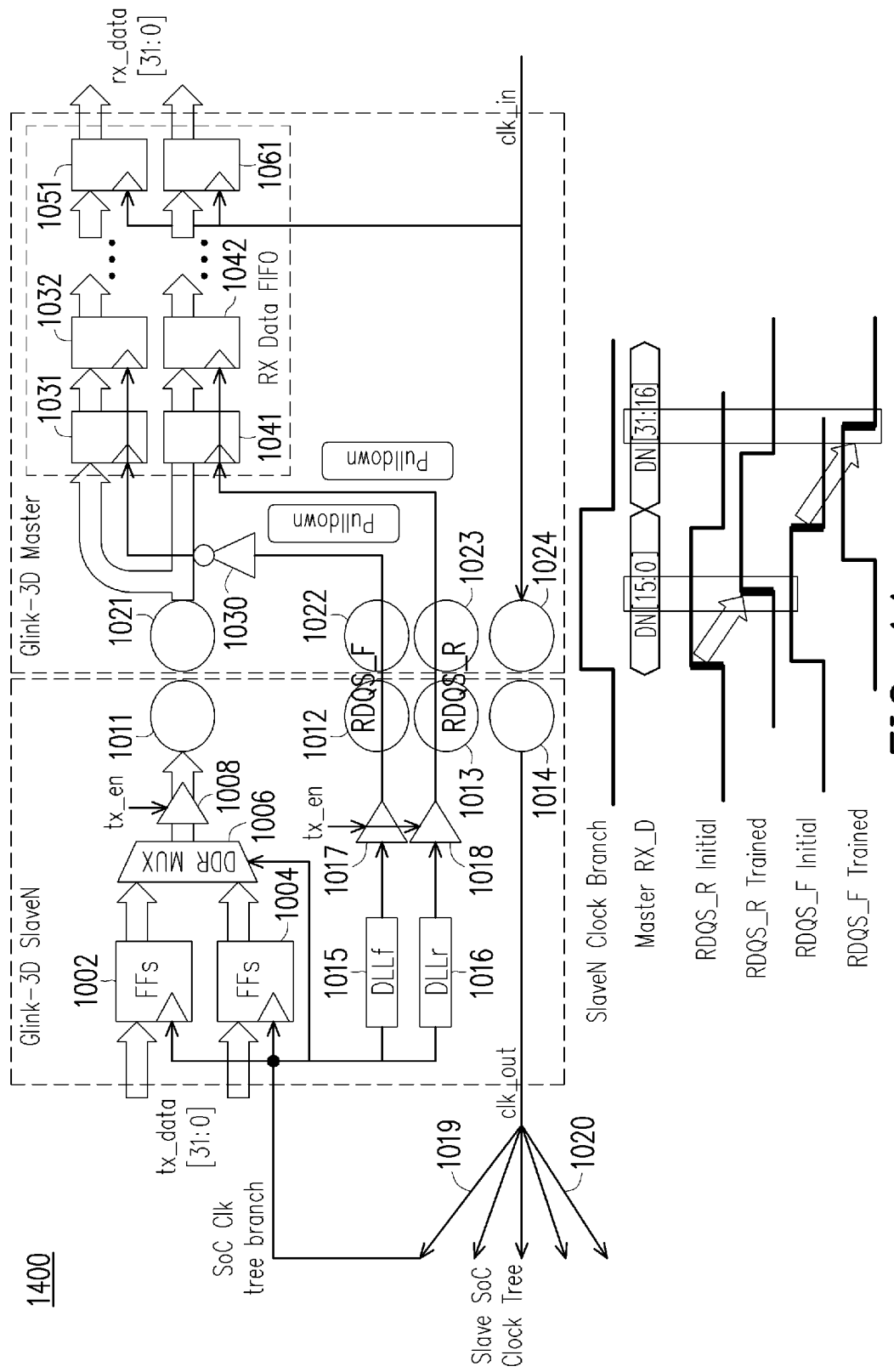
FIG. 14 illustrates a schematically comparison of a first strobe unit and a second strobe unit before and after training according to an embodiment of the disclosure.

FIG. 14 illustrates a schematically comparison of a first strobe unit and a second strobe unit before and after training according to an embodiment of the disclosure. The block schematic diagram 1400 of FIG. 14 represents the block diagram 1000 of FIG. 10. The difference between FIG. 14 and FIG. 10 is that the circuit diagram 1400 includes the comparison of the first strobe 1015 and the second strobe 1016 before and after training.

In this embodiment, the slave device (i.e., slaveN device) and the other slave devices (i.e., slaveK device) train the first strobe 1015 and the second strobe 1016 in order to locate the part of data (i.e., DN[31:16]) and the other part of data (i.e., DN[15:0]) at optimal data sampling point. The part of data (i.e., DN[31:16]) and the other part of data (i.e., DN[15:0]) are called as, for example, data cluster. Specifically, when the semiconductor device is started/turned-on, the master device selects the slave devices one by one for training. For example, the master device selects the slaveN device. The slaveN device, selected by the master device, manages a training sequence which is described as follows. The slaveN device sets the first strobe 1015 and the second strobe 1016 of the Glink-3D slaveN to zero, which are represented by the first local clock RDQS_F Initial and the second local clock RDQS_R Initial. And then, the slaveN device sends the BIST data (i.e., DN[31:16] and DN[15:0]) to the master device. The master device receives the BIST data (i.e., DN[31:16] and DN[15:0]) at the corresponding master bonds, which is, for example, represented by RX_D. The master device reports to the slaveN device pass/fail separately for the data DN[31:16] and DN[15:0]. The slaveN device increments the phase of the first local clock RDQS_F Initial and the second local clock RDQS_R Initial. The process of incrementing the phase of the first local clock RDQS_F Initial and the second local clock RDQS_R Initial is continued until the slaveN device receives the first pass and the last pass reported by the master device. The slaveN device stops to send the BIST data to the master device when the master device reports the last pass. The last pass is obtained, for example, after the master device report the fail after reporting the pass. And then, the slaveN device sets the phase of the first local clock and the phase of the second local clock at the middle point by, for example, dividing the total pass by 2. Accordingly, the slaveN device sends ready data to the master device. The first pass is represented by, for example, RDQS_F Initial and RDQS_R Initial for the first local clock and the second local clock respectively. The middle point is represented by, for example, RDQS_F Trained and RDQS_R Trained for the first local clock and the second local clock respectively. The middle point represents an optimal data sampling point.

That is, the optimal data sampling point is obtained by incrementing the phase of the first local clock of the first strobe 1015 and incrementing the phase of the second local clock of the second strobe 1016 separately until the optimal sampling point is obtained.

In another embodiment, the slave device (i.e., slaveN device) uses a first clock of a first strobe and a second clock of a second strobe of the master interface Glink-3D master to update the first local clock of the first strobe and the second local clock of the second strobe of the slave interface (i.e., Glink-3D slaveN) in order to compensate voltage-to-temperature (V-T) changes.

For instance, the semiconductor device has a normal temperature during a normal processing and has a high temperature during a high processing. The data sent from the slave device (i.e., slaveN device) via the slave interface (i.e., Glink-3D slaveN) to the master device via the Glink-3D during the high temperature has, for example, greater duration/period than during the normal temperature. The slaveN device updates the phase of the first local clock (i.e., RDQS_F Trained) and the phase of the second local clock (i.e., RDQS_F Trained) according to the period of the data under the high temperature and the period of the data under the normal temperature. The updating process is performed by comparing the middle point of the data under the normal temperature and the middle point of the data under the high temperature.

That is, by updating the phase of the first local clock and the second local clock of the slave interface according to the first clock and the second clock of the master interface under different temperature, the V-T changes can be compensated. Therefore, the master interface samples the data received from the slave interface at the optimal data sampling point.

Figure 15:
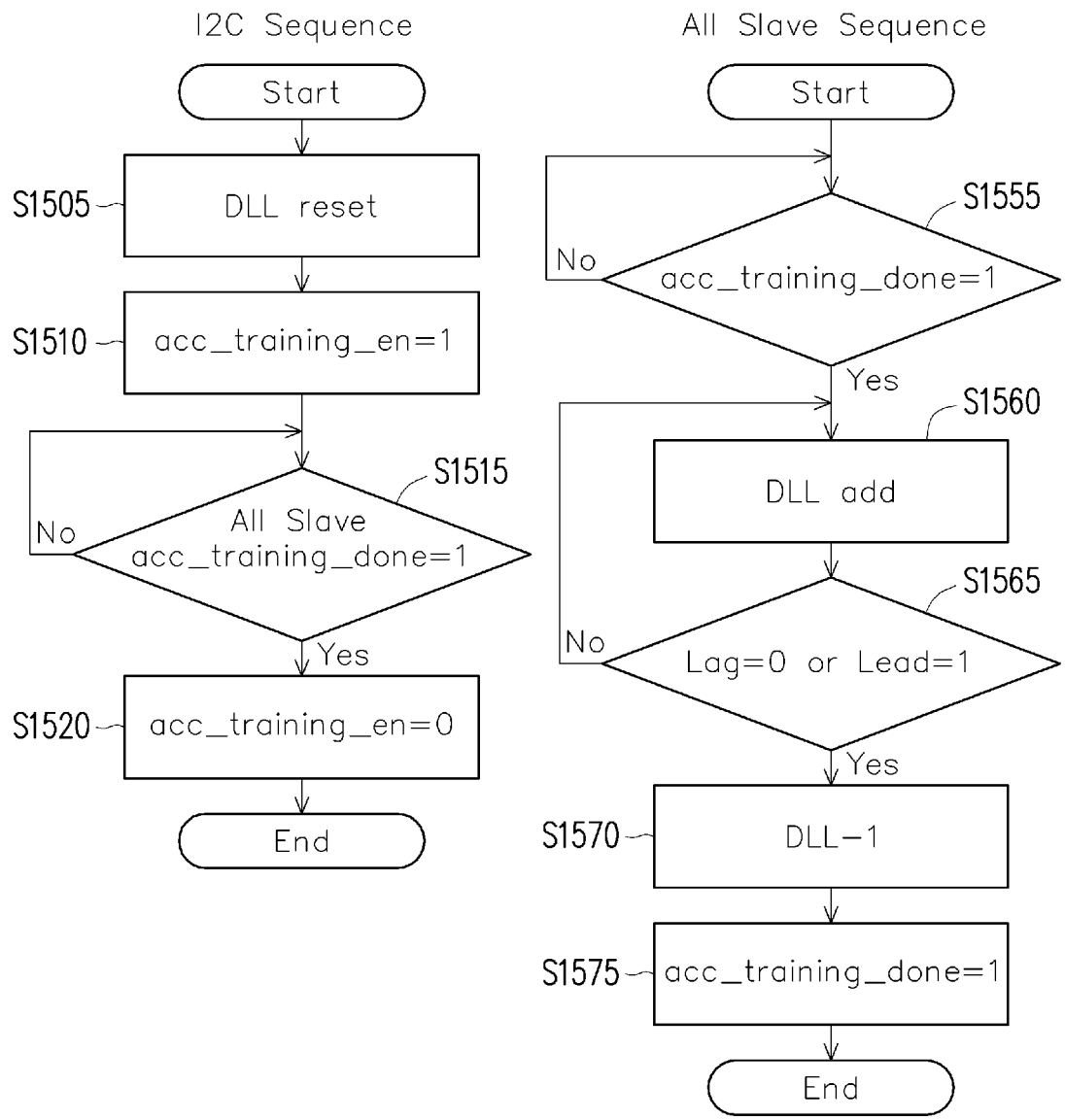
FIG. 15 illustrates a schematically flow diagram of DLL training according to an embodiment of the disclosure.

FIG. 15 illustrates a schematically flow diagram of DLL training according to an embodiment of the disclosure. The flow diagram 1500 is performed before in the beginning of the DLL training. The DLL training intends to obtain the maximum steps of the DLL. The maximum steps of the DLL refer to the ability of the DLL to delay the clock in the slave interface (i.e., Glink-3D slaveN). The DLL refers to the first strobe 1015 and the second strobe 1016. The DLL training is performed in two different point of views including the I2C sequence and the slave sequence. The I2C sequence is a flow diagram performed in the I2C protocol. And the slave sequence is a flow diagram performed in the slave.

In the I2C sequence, the DLL training is performed from step S1505 to step S1520. In the step S1505, the DLL value is cleared/reset. And then, in the step S1510, the register of each slave is set to enable the DLL training by, for example, changing the DLL training flag to 1. The register used to enable the DLL training refers to the accumulator (ACC). In the step S1515, the slave flag indicating that the DLL training is finished is checked. The step S1515 is performed until the slave flag indicating that the DLL training is finished is set by, for example, changing the corresponding flag to 1. The step S1515 is performed to all slaves (i.e., slaveN device, slaveK device). In the step S1520, when the corresponding flags of all slaves are set, the DLL training flag is reset by, for example changing the DLL training flag to 0. By doing so, the register of each slave representing the DLL training is disabled. That is, by performing the steps S1505 to S1520, the maximum step/delay of the DLL for each slave devices are obtained.

In the slave sequence, the DLL training is performed by steps S1555 to S1575. In the step S1555, the slave device (i.e., slaveN device) checks whether the DLL training is enabled. In the step S1560, if the DLL training is enabled, the DLL value is increased by, for example, adding 1 to the DLL value. In the step S1565, the lag flag and the lead flag are checked. The lag flag shows 0 and the lead flag shows 1 if the DLL value is maximum, therefore, the step S1560 is repeated if the DLL value is not maximum. If the DLL value is maximum, the step is continued to the step S1570 by decreasing the DLL value by 1. The reason of decreasing the DLL value by 1 is that the maximum value represents the last value of the DLL value in condition when the condition in the step S1565 is No. At the end, in the step S1575, the slave device sets the flag representing that the DLL training is finished. That is, the flag representing that the DLL is finished represents that the DLL training for the slave device (i.e., slaveN device) is finished. Accordingly, the maximum DLL value is obtained. The steps S1555 to S1575 are performed by each slave.

Figure 16:
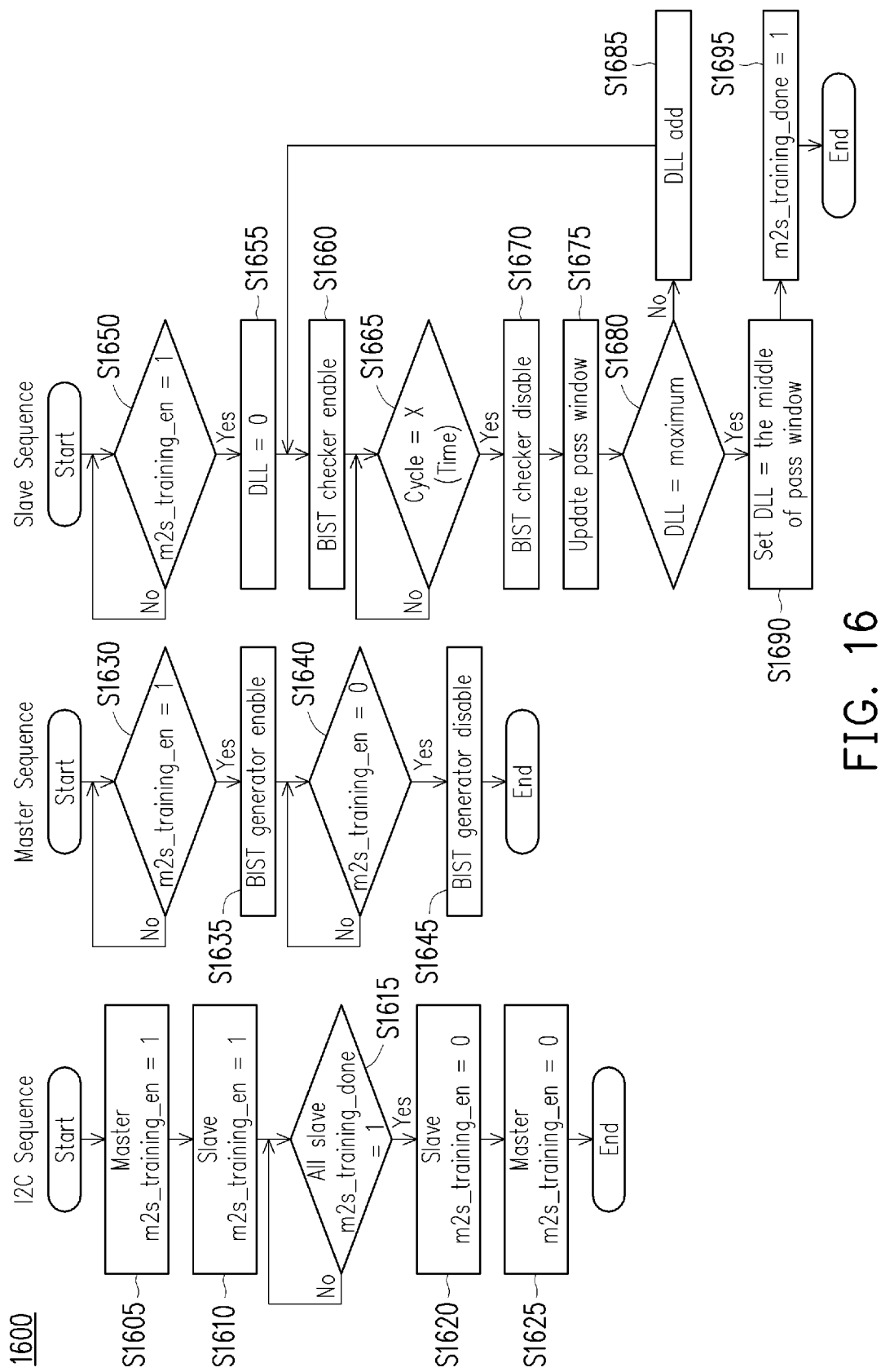
FIG. 16 illustrates a schematically flow diagram of write data cluster training according to an embodiment of the disclosure.

FIG. 16 illustrates a schematically flow diagram of write data cluster training according to an embodiment of the disclosure. After obtaining the maximum DLL value according to the flow diagram 1500, the DLL training is continued by the write data cluster training as shown in the flow diagram 1600. The write data cluster training refers to the master-to-slave training because the write data cluster training is performed for writing the data from the processor 105 to the slave devices (i.e., slaveN device, slaveK device) according to the optimum clock phase. The write data cluster training is performed in various point of views including the I2C sequence, the master sequence, and the slave sequence. The write data cluster training aims to obtain the middle value of the DLL during writing the data. By writing the data according to the middle value of the DLL, the data is written correctly, therefore, the bit error can be minimized. The middle value of the DLL represents the optimum clock phase.

In the I2C sequence, the write data cluster training is performed in steps S1605 to S1625. In the step S1605, the corresponding register of the processor 105 is set to enable the write data cluster training. In the step S1610, the register of each slave is set to enable the write data cluster training. In the step S1615, the register of each slave corresponding to that the write data cluster training is finished is checked. If the register of each slave corresponding to that the write data cluster training is finished is set, the step S1620 is performed by disabling the register of each slave. In the step S1625, the register of the processor 105 is disabled. That is, by obtaining that the register of each slave corresponding to that the write data cluster training is finished, the DLL value of each slave has been optimized for writing data. Therefore, the bit error can be minimized.

In the master sequence, the write data cluster training is performed in steps S1630 to S1645. In the step S1630, the processor 105 checks whether or not the write data cluster training is enabled. If the write data cluster training is enabled, the BIST generator is enable in the step S1635. In the step S1640, the processor 105 checks whether or not the write data cluster training is disabled. The write data cluster training is disabled in condition when the write data cluster training to all slaves has been finished. In the step S1645, since the write data cluster training to all slaves has been finished, the BIST generator is disabled. That is, by obtaining that the write data cluster training is disabled, the write data cluster training to all slaves have been finished. Therefore, the optimum clock phase for writing data has been obtained.

In the slave sequence, the write data cluster training is performed in steps S1650 to 1695. In the step S1650, the register corresponding to that the write data cluster training is enabled is checked. In response to that the write data cluster training is enabled, the DLL value is set to 0 in the step S1655. In the step S1660, the BIST checker is enabled. By enabling the BIST checker, the BIST generated by the processor 105 is checked. In the step S1665, the BIST is checked within, for example, X times. X represents the integer value equal to or greater than 1. X may also represent the time duration to check the BIST. If the BIST has been checked for X times, the BIST checker is disabled in the step S1670. In the step S1675, the DLL window representing the pass value is updated. The pass value represents that the BIST is read by the slave correctly. In the step S1680, the DLL value is checked whether reaching the maximum value. The maximum value of DLL has been obtained according to FIG. 15. If the DLL value is not maximum, the DLL value is increased in the step S1685. And then, the steps S1660 to S 1685 are repeated until the DLL value reaches maximum cycle/value. In the step S1690, if the DLL value reaches maximum cycle, the DLL value is set to the middle of pass window. The middle of pass window represents that the BIST is written to slave device at optimum clock phase. In the step S1695, the register representing that write data cluster training is done is set by, for example, changing the corresponding flag to 1. In the master sequence, the processor 105 checks this flag to determine that the write data cluster training has been done to all slaves.

Figure 17:
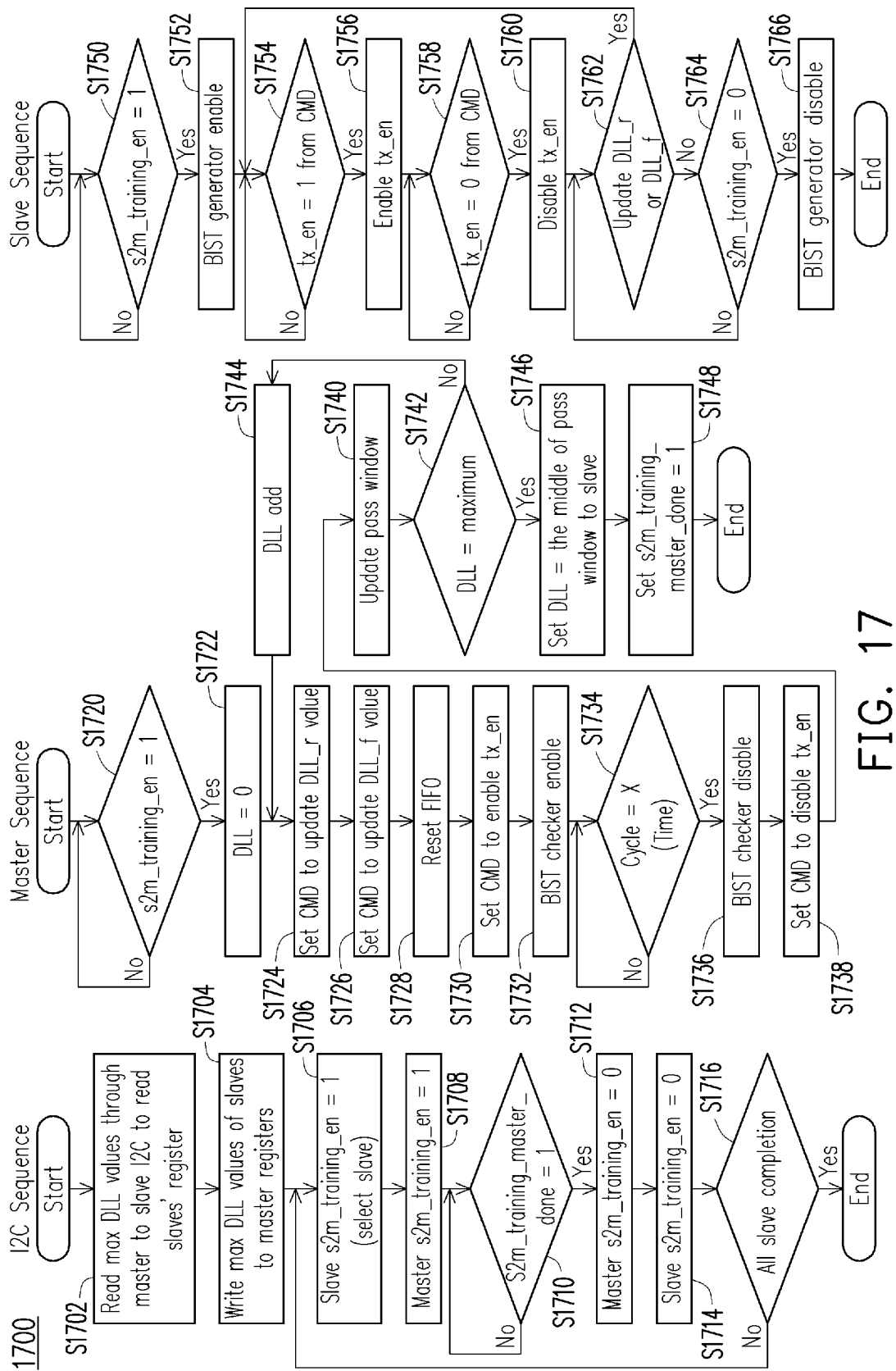
FIG. 17 illustrates a schematically flow diagram of read data cluster training according to an embodiment of the disclosure.

FIG. 17 illustrates a schematically flow diagram of read data cluster training according to an embodiment of the disclosure. The flow diagram 1700 may be performed after the flog diagram 1600. The read data cluster training is performed to obtain the optimum clock phase for reading data. The read data cluster training is performed in various point of views including the I2C sequence, the master sequence, and the salve sequence.

In the I2C sequence, the read data cluster training is performed in steps S1702 to S1716. In the step S1702, the maximum DLL value is read from the corresponding register of the slave device. In the step S1704, the DLL value read from the corresponding register of the slave device is written to the register of the processor 105. In the step S1706, the corresponding flag representing that the read data cluster training is enabled is set to the register of the slave device. In the step S1708, the corresponding flag representing that the read data cluster training is enabled is set to the register of the processor 105. In the step S1710, the corresponding flag representing that the read data cluster training is done is checked from the slave device. In the step S1712, if the corresponding flag representing that the read data cluster training is done is enabled, the corresponding flag of the processor 105 representing the read data cluster training is disabled. In the step S1714, the corresponding flag of the slave device representing the read data cluster training is disabled. In the step S1716, each slave is checked whether or not the read data cluster training has been performed. If the process of the read data cluster training is not yet performed by one or more slaves, the steps S1706 to 1716 are repeated until all slaves has performed the read data cluster training. That is, By obtaining that the corresponding flag of the register of each slave device is enabled, the read data cluster training has been performed by each slave device.

In the master sequence, the read data cluster training is performed in steps S1720 to S1748. In the step S1720, the processor 105 checks the flag of the register corresponding to the read data cluster training. In the step S1722, if the flag of the register corresponding to the read data cluster training is enabled, the DLL value is set to 0. In the step S1724, the processor 105 sets the command to update the DLL_r value. In the step S1726, the processor 105 sets the command to update the DLL_f value. In the step S1728, the processor 105 resets the read FIFO. The reason that the read FIFO needs to be reset is to avoid that the processor 105 read wrong sequence of read data from the slave devices. If the read FIFO is not clear, the data sequence in the read FIFO may not represents the correct sequence of data. In the step S1730, the processor 105 sets command to enable tx_en. In the step S1732, the processor 105 enables the BIST checker. By enabling the BIST checker, the processor is ready to read the BIST data generated by the slave device. In the step S1734, the BIST data generated by the slave device is read within X times. The X has been described in the previous description. In the step S1736, if the BIST data has been read within X times, the processor 105 disables the BIST checker. In the step S1738, the processor 105 sets command to disable tx_en. In the step S1740, the processor 105 updates the pass window. The pass window has been described in the previous description. In the step S1742, the DLL value is checked whether or not reaches the maximum cycle/value. In the step S1744, if the DLL value is not reach the maximum cycle, the DLL is increased. And then, the steps S1724 to S1744 are repeated until the DLL value reaches the maximum value. In the step S1746, if the DLL value has reached the maximum value, the DLL is set to slave to the middle value of pass window. In the step S1748, the flag representing that the read data cluster training is done is set.

In the slave sequence, the read data cluster training is performed in steps S1750 to S1766. In the step S1750, the flag corresponding to the read data cluster training enable is checked. In the step S1752, if the flag corresponding to the read data cluster training enable is set, the BIST generator is enabled. By enabling the BIST generator, the slave device generates the BIST data and accordingly sends the BIST data to the processor 105. In the step S1754, the slave device checks whether the processor 105 sets the tx_en from command. In the step S1756, the processor 105 sets the tx_en from command, the slave device enables the tx_en. In the step S1758, the slave device checks whether the processor 105 clears the tx_en from command. In the step S1760, the processor 105 clears the tx_en from command, the slave device disables the tx_en. In the step S1762, the slave device checks whether or not to update the DLL_r of DLL_f. If the DLL_r or the DLL_f is updated, the steps S1754 to S1762 are repeated. In the step S1764, if the slave device does not update the DLL_r or the DLL_f, the flag representing that the read data cluster training is disable is checked. If the flag representing that the read data cluster training is not disable, the steps S1762 to S1764 are repeated. In the step S1766, of the flag representing that the read data cluster training is disable, The BIST generator is disabled. That is, the slave device updates the DLL_r and/or the DLL_f by performing the read data cluster training.

Moreover, the example of command used for read data cluster training is provided as follows. Since the DLL value used in the read data cluster training is 9 bits, these 9 bits are generated by combining the first bit of read command (S_CMD[0]), 4 bits of slave-to-master ID (S_DID[3:0]), and 4 bits of master-to-slave ID (M_DID[3:0]). On the other hand, the command is generated by combining the second bit of read command (S_CMD[1]) and 2 bits of the write command (M CMD[1:0]). For example, the command generates the IDLE command by setting the bit values to {0, 0, 0}. The command generates the update DLL_r value command by setting the bit values to {0, 0, 1}. The command generates the update DLL_f value command by setting the bit values to {0, 1, 0}. The command generates the update DLL value command by setting the bit values to {0, 1, 1}. The command generates the tx_en enable command by setting the bit values to {1, 0, 1}. The command generates the tx_en disable command by setting the bit values to {1, 1, 0}.

Figure 18:
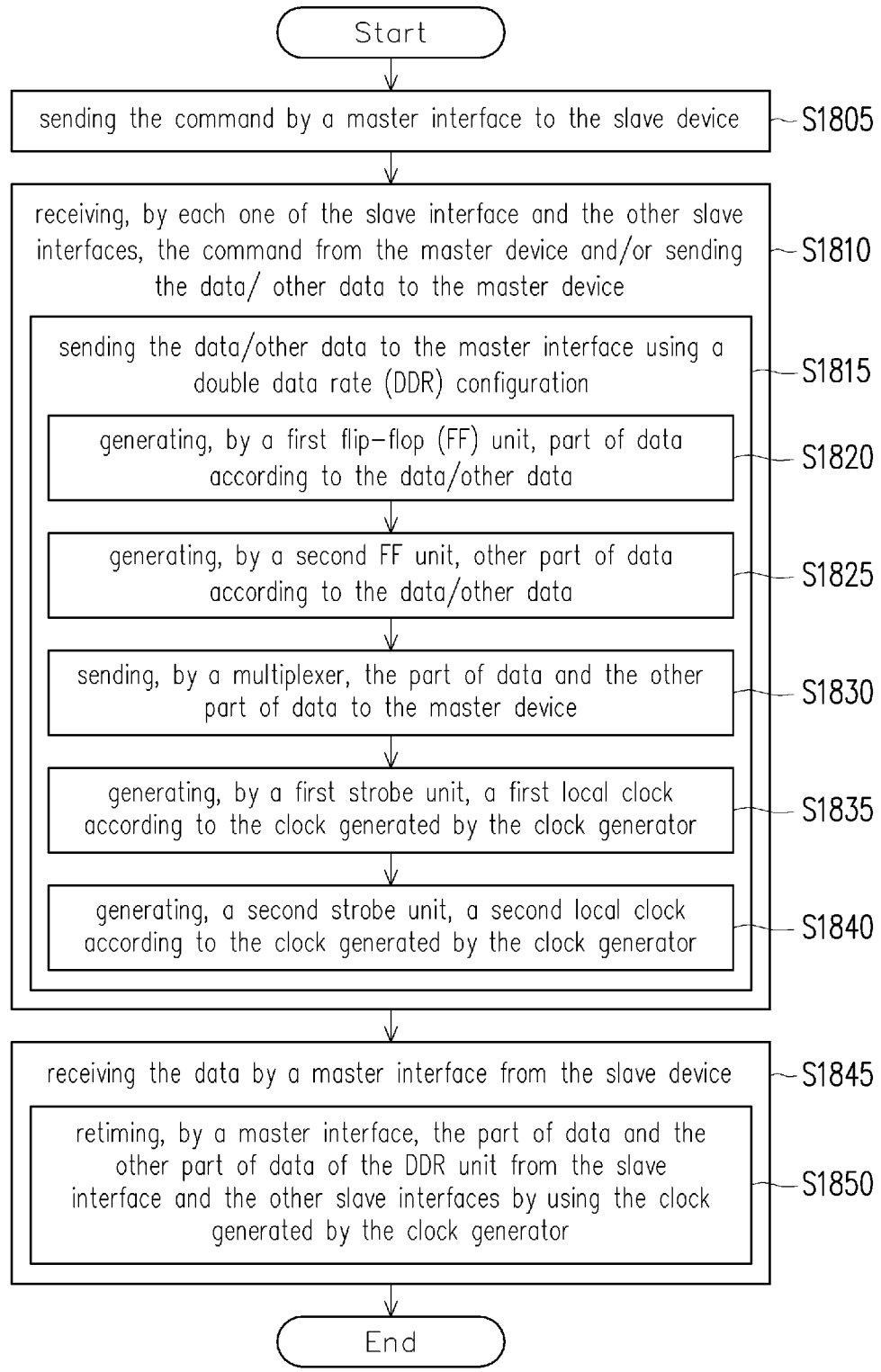
FIG. 18 illustrates an interface method according to an embodiment of the disclosure.

FIG. 18 illustrates an interface method according to an embodiment of the disclosure. The interface method of the semiconductor device is start by sending the command by a master interface to the slave device is step S1805. In step S1810, the interface method is continued by receiving, by each one of the slave interface and the other slave interfaces, the command from the master device and/or sending the data/other data to the master device. The step S1810 includes sending the data/other data to the master interface using a double data rate (DDR) configuration in step S1815. The step S1815 includes steps S1820 to S1840. In the step 1820, the apparatus method is continued by generating, by a first flip-flop (FF) unit, part of data according to the data/other data. In the step S1825, the apparatus method is continued by generating, by a second FF unit, other part of data according to the data/other data. In the step S1830, the apparatus method is continued by sending, by a multiplexer, the part of data and the other part of data to the master device. In the step 1835, the apparatus method is continued by generating, by a first strobe unit, a first local clock according to the clock generated by the clock generator. In the step S1840, the apparatus method is continued by generating, a second strobe unit, a second local clock according to the clock generated by the clock generator. And then, the apparatus method is continued by receiving the data by a master interface from the slave device is step S1845. The step S1845 includes retiming, by a master interface, the part of data and the other part of data of the DDR unit from the slave interface and the other slave interfaces by using the clock generated by the clock generator in step S1850.

In summary, the interface device and the interface method for the 3D semiconductor device provides the reliable data communication between the master device and the slave device. The reliable data communication is achieved by providing the specific time slot to each slave device. The master device also provides data latency between the slave devices. By doing so, the bus contention between slave devices can be avoided. Moreover, in order to sample the data with optimal sampling phase, the slave apparatus trains the local clock when the semiconductor device is started/turned-on. By training the local clock, the data can be sampled at the optimal data sampling point, as such, the error rate can be reduced. In addition, the slave device also updates the local clock to compensate the V-T changes of the semiconductor device.

In another embodiment, the interface device for interfacing between a master device and a slave device, wherein the master device generates command and the slave device generates data according to the command, the interface device includes a master interface and a slave interface. The master interface is coupled to the master device. The master interface is configured to send the command to the slave device and/or receive the data from the slave device. The slave interface is coupled to the slave device. The slave interface is configured to receive the command from the master device and/or send the data to the master device. The master interface and the slave interface are driven by a clock generated by a clock generator. The master interface and the slave interface are electrically connected by one or plurality of bonds and/or TSVs. The clock which drives the slave interface is trained by changing a clock phase of the clock to be aligned with a data cluster of the command and/or a data cluster of the data.

In another embodiment, the interface device further includes other slave interfaces. The other slave interfaces are coupled to other slave devices in one-to-one relationship. The other slave interfaces are configured to receive the command from the master device and/or send other data generated by the other slave devices to the master device. The other slave interfaces are driven by the clock generated by the clock generator and electrically connected to the master interface by the one or plurality of bonds and/or TSVs. Each clock which drives each one of the other slave interfaces is trained by changing a clock phase of each clock to be aligned with a data cluster of the command and/or a data cluster of the data corresponding to each one of the other slave interfaces.

In another embodiment, each one of the slave interface and the other slave interfaces are further configured to send the data/other data to the master interface using a double data rate (DDR) configuration. The DDR configuration is generated by a DDR unit. The DDR unit includes a first flip-flop (FF) unit, a second FF unit, and a multiplexer. The first FF unit is configured to generate part of data according to the data/other data. The second FF unit is configured to generate other part of data according to the data/other data. The multiplexer is coupled to the first FF unit and the second FF unit. The multiplexer is configured to send the part of data and the other part of data to the master device.

In another embodiment, each one of the slave interface and the other slave interfaces further includes a first strobe unit and a second strobe unit. The first strobe unit is configured to generate a first local clock according to the clock generated by the clock generator. The second strobe unit is configured to generate a second local clock according to the clock generated by the clock generator. The first local clock generated by the first strobe unit is used by the master interface to read the part of data generated by the first FF unit. The second local clock generated by the second strobe unit is used by the master interface to read the other part of data generated by the second FF unit.

In another embodiment, the master device further generates a turn-around (TA) cycle. The TA cycle is used to prevent bus contention between the slave device and the other slave devices responses. In another embodiment, the TA cycle is used to compensate a round-trip-delays (RTDs) difference between the slave device and the other slave devices. In another embodiment, the slave device and the other slave devices generate zero data before and after the data in order to prevent contention between the slave device and the other slave devices due to different the RTDs. In another embodiment, the master interface further comprises a first-in-first-out (FIFO) unit configured to retime the part of data and the other part of data of the DDR unit from the slave interface and the other slave interfaces by using the clock generated by the clock generator. In another embodiment, the slave device and the other slave devices train the first strobe unit and the second strobe unit in order to locate the part of data and the other part of data at optimal data sampling point.

In another embodiment, an interface method for interfacing between a master device and a slave device, wherein command is generated by the master device and data is generated by the slave device according to the command, the interface method includes sending, by a master interface, the command to the slave device and/or receiving the data from the slave device, and receiving, by a slave interface, the command from the master device and/or sending the data to the master device. The master interface and the slave interface are driven by a clock generated by a clock generator. The master interface and the slave interface are electrically connected by one or plurality of bond and/or TSVs. The clock which drives the slave interface is trained by changing a clock phase of the clock to be aligned with a data cluster of the command and/or a data cluster of the data.

In another embodiment, the interface method further includes receiving, by other slave interfaces, the command from the master device and/or send other data generated by the other slave devices to the master device. the other slave interfaces are driven by the clock generated by the clock generator and electrically connected to the master interface by the one or plurality of bonds and/or TSVs. Each clock which drives each one of the other slave interfaces is trained by changing a clock phase of each clock to be aligned with a data cluster of the command and/or a data cluster of the data corresponding to each one of the other slave interfaces.

In another embodiment, receiving, by each one of the slave interface and the other slave interfaces, the command from the master device and/or sending the data/other data to the master device further includes sending the data/other data to the master interface using a double data rate (DDR) configuration. Sending the data/other data to the master interface using a double data rate (DDR) configuration further includes generating, by a first flip-flop (FF) unit, part of data according to the data/other data, generating, by a second FF unit, other part of data according to the data/other data, and sending, by a multiplexer, the part of data and the other part of data to the master device.

In another embodiment, sending the data/other data to the master interface using the DDR configuration further includes generating, by a first strobe unit, a first local clock according to the clock generated by the clock generator, and generating, a second strobe unit, a second local clock according to the clock generated by the clock generator. The first local clock generated by the first strobe unit is used by the master interface to read the part of data generated by the first FF unit. The second local clock generated by the second strobe unit is used by the master interface to read the other part of data generated by the second FF unit.

In another embodiment, a turn-around (TA) cycle is further generated by the master device. The TA cycle is used to prevent bus contention between the slave device and the other slave devices responses. In another embodiment, the TA cycle is used to compensate a round-trip-delays (RTDs) difference between the slave device and the other slave devices. In another embodiment, zero data before and after the data is generated by the slave device and the other slave devices in order to prevent contention between the slave device and the other slave devices due to different the RTDs. In another embodiment, sending, by the master interface, the command to the slave device and/or receiving the data from the slave device further includes retiming the part of data and the other part of data of the DDR unit from the slave interface and the other slave interfaces by using the clock generated by the clock generator. In another embodiment, the first strobe unit and the second strobe unit are trained by the slave device and the other slave devices in order to locate the part of data and the other part of data at optimal data sampling point.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An interface device for interfacing between a master device and a slave device, wherein the master device generates a command and the slave device generates a data according to the command, the interface device comprising:
   a master interface, coupled to the master device, configured to send the command to the slave device and/or receive the data from the slave device; and
   a slave interface, coupled to the slave device, configured to receive the command from the master device and/or send the data to the master device, wherein
   the master interface and the slave interface are driven by a clock generated by a clock generator,
   the master interface and the slave interface are electrically connected by one or plurality of bonds and/or TSVs,
   the clock which drives the slave interface is trained by changing a clock phase of the clock to be aligned with a data cluster of the command and/or a data cluster of the data.

2. The interface device of claim 1, further comprising other slave interfaces, coupled to other slave devices in one-to-one relationship, configured to receive the command from the master device and/or send other data generated by the other slave devices to the master device, wherein
   the other slave interfaces are driven by the clock generated by the clock generator and electrically connected to the master interface by the one or plurality of bonds and/or TSVs,
   each clock which drives each one of the other slave interfaces is trained by changing a clock phase of each clock to be aligned with a data cluster of the command and/or a data cluster of the data corresponding to each one of the other slave interfaces.

3. The interface device of claim 2, wherein each one of the slave interface and the other slave interfaces are further configured to send the data/other data to the master interface using a double data rate (DDR) configuration.

4. The interface device of claim 3, wherein the DDR configuration is generated by a DDR unit, the DDR unit comprises:
   a first flip-flop (FF) unit, configured to generate part of data according to the data/other data;
   a second FF unit, configured to generate other part of data according to the data/other data; and
   a multiplexer, coupled to the first FF unit and the second FF unit, configured to send the part of data and the other part of data to the master device.

5. The interface device of claim 3, wherein the master interface further comprises a first-in-first-out (FIFO) unit configured to retime the part of data and the other part of data of the DDR unit from the slave interface and the other slave interfaces by using the clock generated by the clock generator.

6. The interface device of claim 2, wherein each one of the slave interface and the other slave interfaces further comprises:
   a first strobe unit, configured to generate a first local clock according to the clock generated by the clock generator; and
   a second strobe unit, configured to generate a second local clock according to the clock generated by the clock generator,
   wherein the first local clock generated by the first strobe unit is used by the master interface to read the part of data generated by the first FF unit, and the second local clock generated by the second strobe unit is used by the master interface to read the other part of data generated by the second FF unit.

7. The interface device of claim 6, wherein the slave device and the other slave devices train the first strobe unit and the second strobe unit in order to locate the part of data and the other part of data at optimal data sampling point.

8. The interface device of claim 2, wherein the master device further generates a turn-around (TA) cycle,
   wherein the TA cycle is used to prevent bus contention between the slave device and the other slave devices responses.

9. The interface device of claim 8, wherein the TA cycle is used to compensate a round-trip-delays (RTDs) difference between the slave device and the other slave devices.

10. The interface device of claim 9, wherein the slave device and the other slave devices generate zero data before and after the data in order to prevent contention between the slave device and the other slave devices due to different the RTDs.

11. An interface method for interfacing between a master device and a slave device, wherein command is generated by the master device and data is generated by the slave device according to the command, the interface method comprising:
   sending, by a master interface, the command to the slave device and/or receiving the data from the slave device; and
   receiving, by a slave interface, the command from the master device and/or sending the data to the master device, wherein
   the master interface and the slave interface are driven by a clock generated by a clock generator,
   the master interface and the slave interface are electrically connected by one or plurality of bonds and/or TSVs,
   the clock which drives the slave interface is trained by changing a clock phase of the clock to be aligned with a data cluster of the command and/or a data cluster of the data.

12. The interface method of claim 11, further comprising receiving, by other slave interfaces, the command from the master device and/or send other data generated by the other slave devices to the master device, wherein
   the other slave interfaces are driven by the clock generated by the clock generator and electrically connected to the master interface by the one or plurality of bonds and/or TSVs,
   each clock which drives each one of the other slave interfaces is trained by changing a clock phase of each clock to be aligned with a data cluster of the command and/or a data cluster of the data corresponding to each one of the other slave interfaces.

13. The interface method of claim 12, wherein receiving, by each one of the slave interface and the other slave interfaces, the command from the master device and/or sending the data/other data to the master device further comprises sending the data/other data to the master interface using a double data rate (DDR) configuration.

14. The interface method of claim 13, wherein sending the data/other data to the master interface using a double data rate (DDR) configuration further comprises:
   generating, by a first flip-flop (FF) unit, part of data according to the data/other data;
   generating, by a second FF unit, other part of data according to the data/other data; and
   sending, by a multiplexer, the part of data and the other part of data to the master device.

15. The interface method of claim 14, wherein sending the data/other data to the master interface using the DDR configuration further comprises:
   generating, by a first strobe unit, a first local clock according to the clock generated by the clock generator; and
   generating, a second strobe unit, a second local clock according to the clock generated by the clock generator,
   wherein the first local clock generated by the first strobe unit is used by the master interface to read the part of data generated by the first FF unit, and the second local clock generated by the second strobe unit is used by the master interface to read the other part of data generated by the second FF unit.

16. The interface method of claim 15, wherein the first strobe unit and the second strobe unit are trained by the slave device and the other slave devices in order to locate the part of data and the other part of data at optimal data sampling point.

17. The interface method of claim 13, wherein sending, by the master interface, the command to the slave device and/or receiving the data from the slave device further comprises retiming the part of data and the other part of data of the DDR unit from the slave interface and the other slave interfaces by using the clock generated by the clock generator.

18. The interface method of claim 12, wherein a turn-around (TA) cycle is further generated by the master device,
   wherein the TA cycle is used to prevent bus contention between the slave device and the other slave devices responses.

19. The interface method of claim 18, wherein the TA cycle is used to compensate a round-trip-delays (RTDs) difference between the slave device and the other slave devices.

20. The interface method of claim 19, wherein zero data before and after the data is generated by the slave device and the other slave devices in order to prevent contention between the slave device and the other slave devices due to different the RTDs.

* * * * *